United States Patent
Refai-Ahmed et al.

(10) Patent No.: US 11,145,566 B2
(45) Date of Patent: Oct. 12, 2021

(54) STACKED SILICON PACKAGE ASSEMBLY HAVING THERMAL MANAGEMENT

(71) Applicant: XILINX, INC., San Jose, CA (US)

(72) Inventors: Gamal Refai-Ahmed, Santa Clara, CA (US); Suresh Ramalingam, Fremont, CA (US); Jaspreet Singh Gandhi, San Jose, CA (US); Cheang-Whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/786,447

(22) Filed: Feb. 10, 2020

(65) Prior Publication Data
US 2021/0249328 A1    Aug. 12, 2021

(51) Int. Cl.
*H01L 23/367* (2006.01)
*H01L 25/065* (2006.01)

(52) U.S. Cl.
CPC ...... *H01L 23/3672* (2013.01); *H01L 25/0657* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,047,837 | A * | 9/1991 | Kitano | H01L 23/49568 257/666 |
| 2009/0014876 | A1* | 1/2009 | Youn | H01L 25/0657 257/738 |
| 2015/0028448 | A1* | 1/2015 | Hosseini | H01L 24/24 257/531 |
| 2015/0340327 | A1* | 11/2015 | Uzoh | H01L 24/48 257/723 |
| 2017/0092619 | A1* | 3/2017 | Refai-Ahmed | H01L 21/4882 |
| 2017/0372979 | A1* | 12/2017 | Gandhi | H01L 23/562 |
| 2020/0294884 | A1* | 9/2020 | Shaikh | H01L 23/38 |
| 2020/0357721 | A1* | 11/2020 | Sankman | H01L 23/5387 |

OTHER PUBLICATIONS

Unpublished U.S. Appl. No. 16/147,286, filed Sep. 28, 2018, entitled: "Stacked Silicon Package Assembly Having Thermal Management".

* cited by examiner

*Primary Examiner* — Mamadou L Diallo
(74) *Attorney, Agent, or Firm* — Patterson + Sheridan, LLP

(57) ABSTRACT

A chip package assembly and method for fabricating the same are provided which utilize a plurality of electrically floating heat transfer structures for improved thermal management. In one example, a chip package assembly is provided. The chip package assembly includes a substrate, a first integrated circuit (IC) die and a plurality of electrically floating conductive heat transfer structures. The substrate has a first surface and an opposing second surface. The first IC die has a first surface, an opposing second surface, and four lateral sides. The second surface of the first IC die is mounted to the first surface of the substrate. The plurality of electrically floating conductive heat transfer structures extend in a first direction defined between the first and second surfaces of the first IC die. A first conductive heat transfer structure of the plurality of electrically floating conductive heat transfer structures are part of a first conductive heat transfer path having a length in the first direction at least as long as a distance between the first and second surfaces.

20 Claims, 9 Drawing Sheets

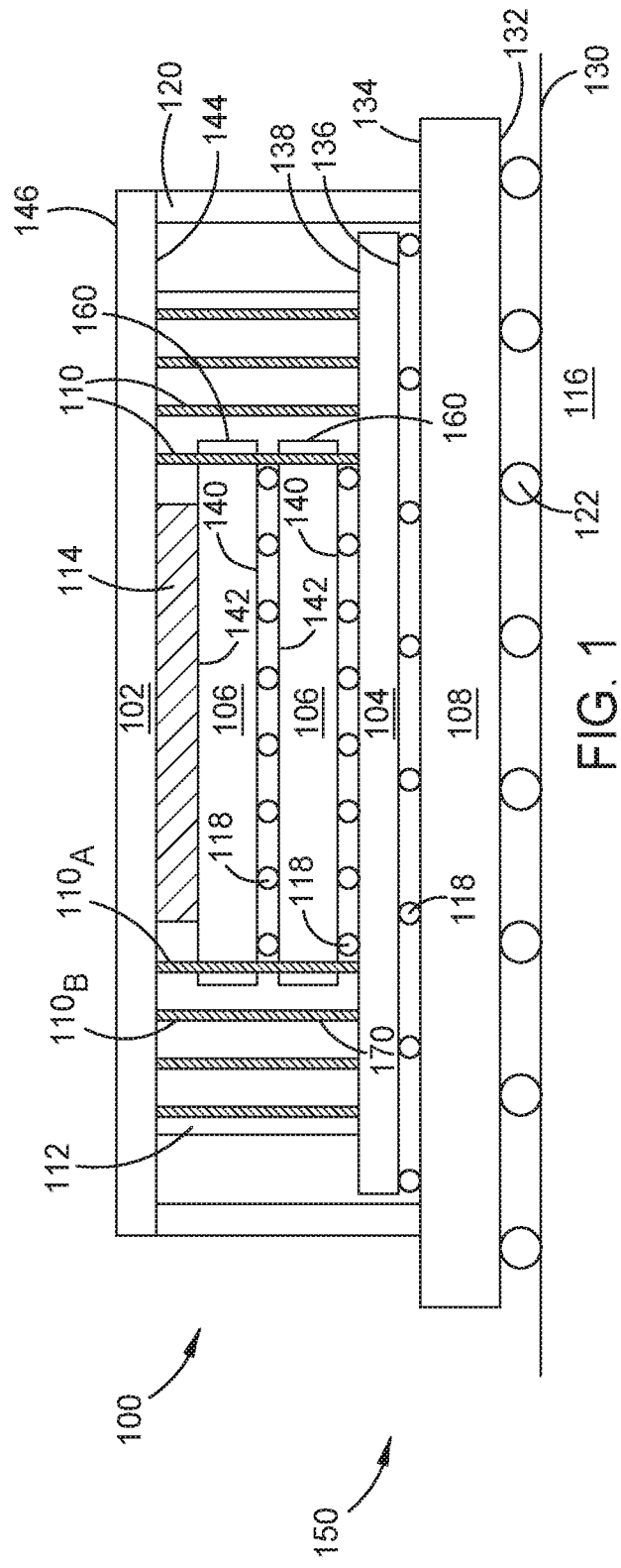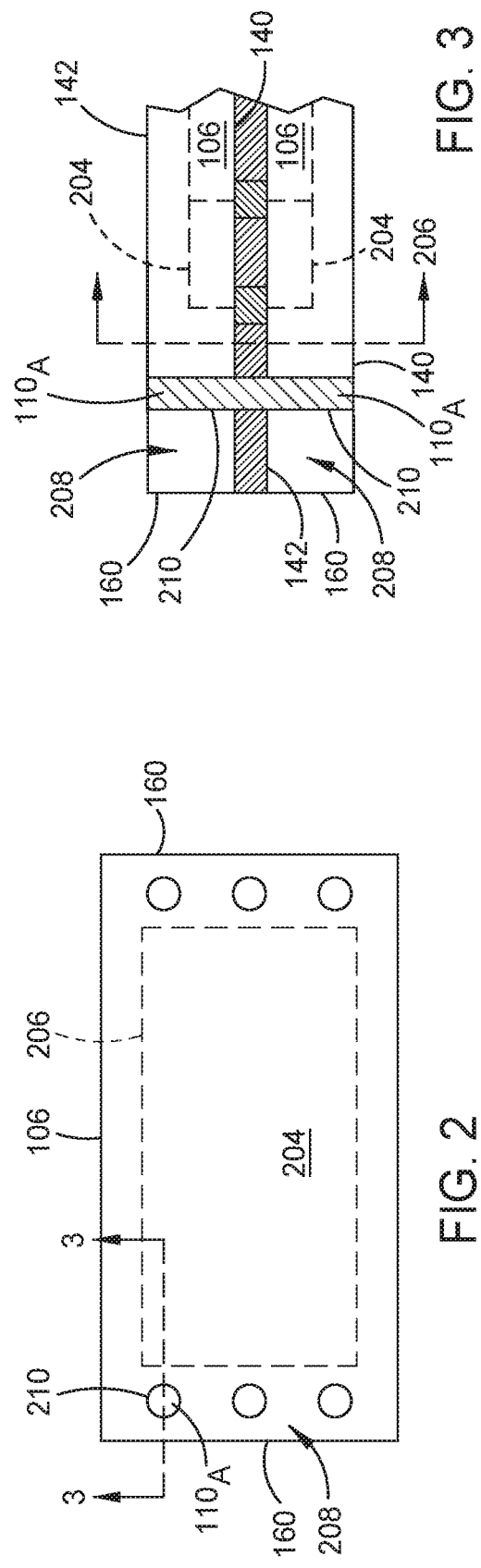
FIG. 1
FIG. 2
FIG. 3

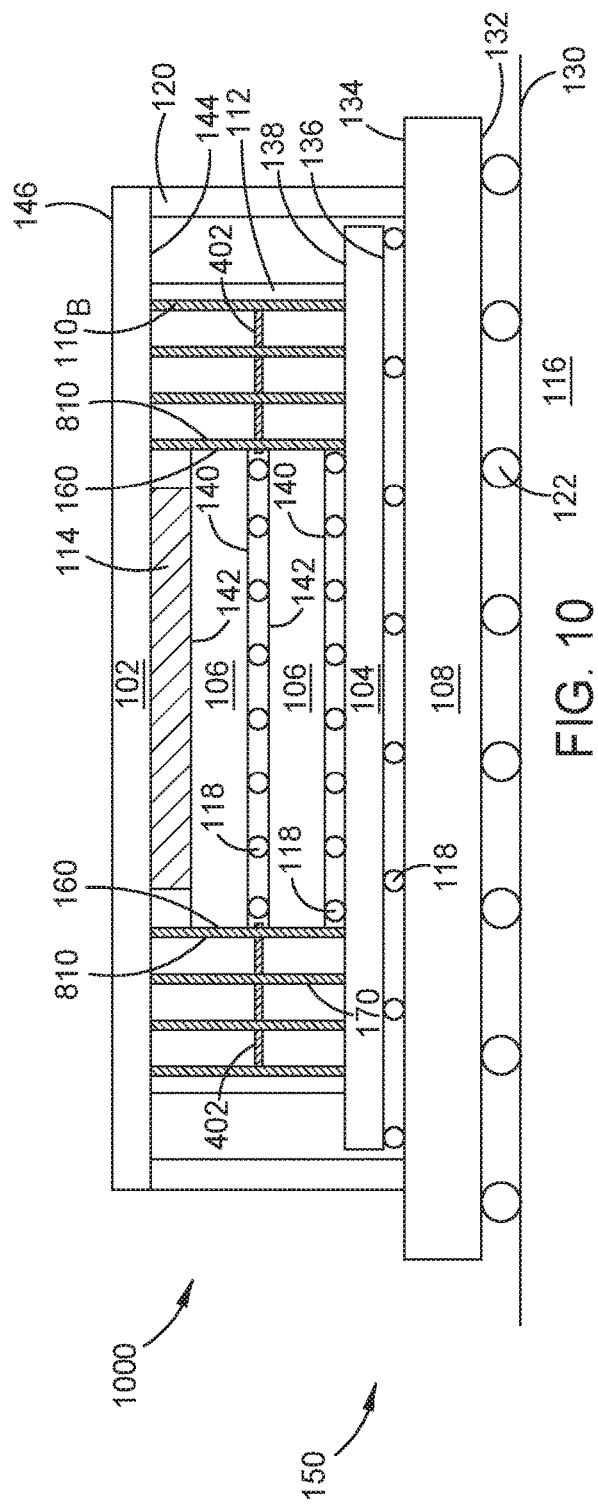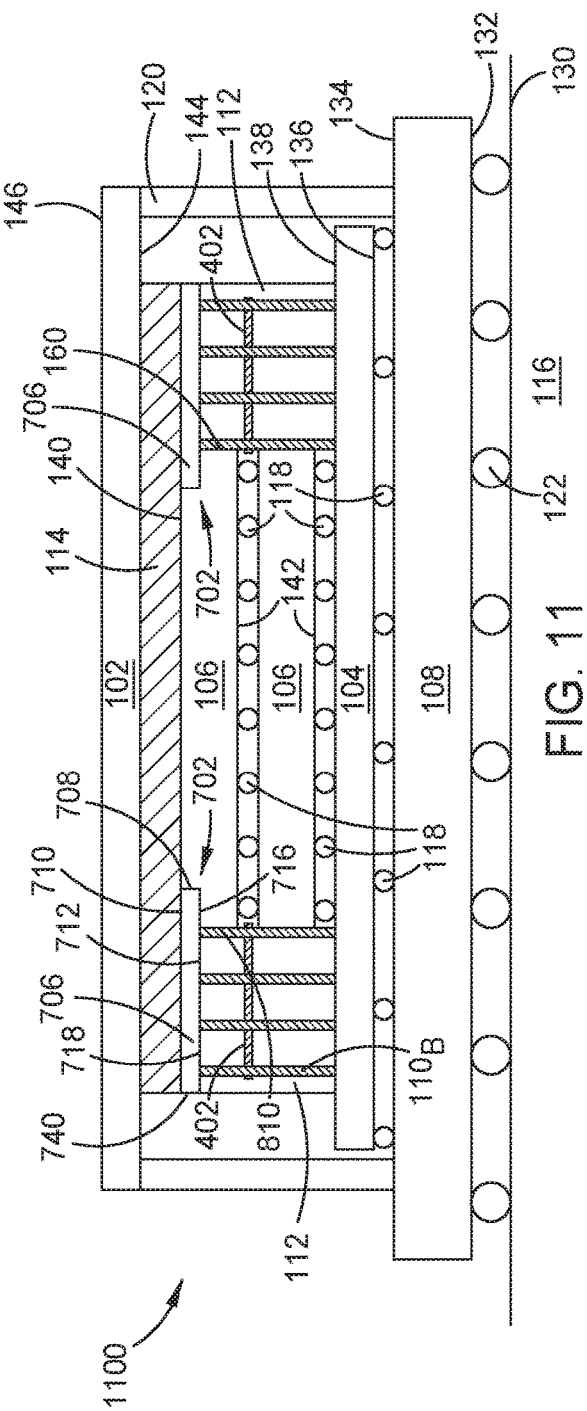

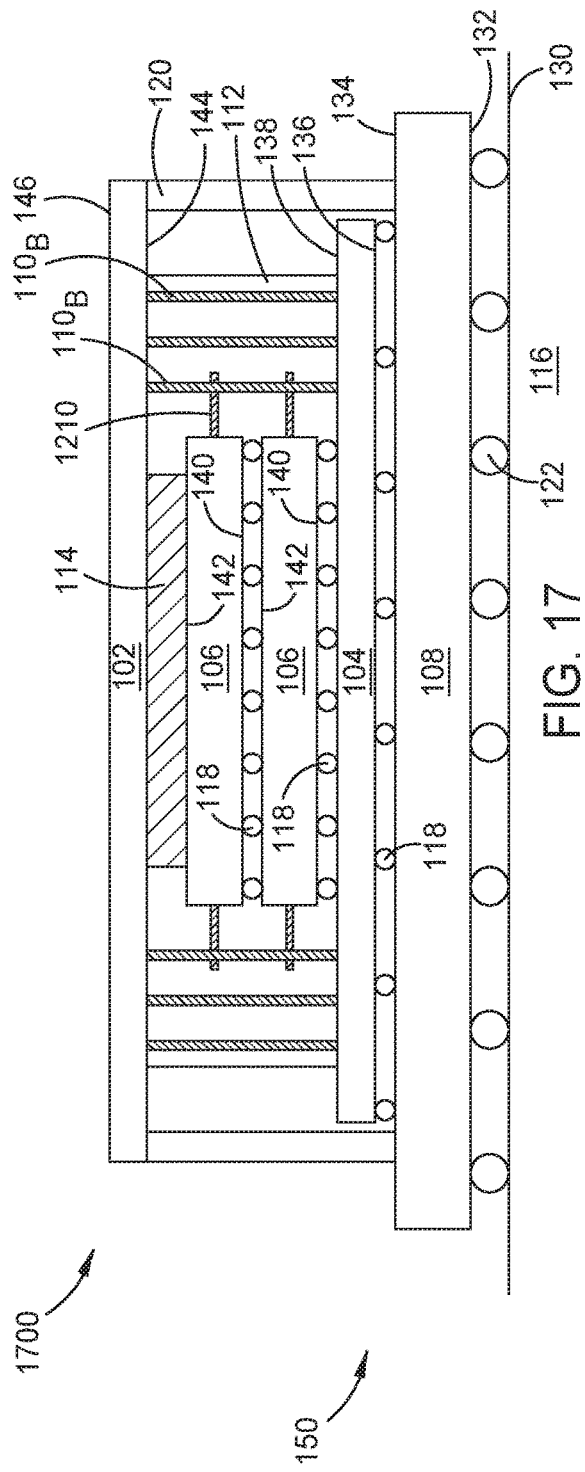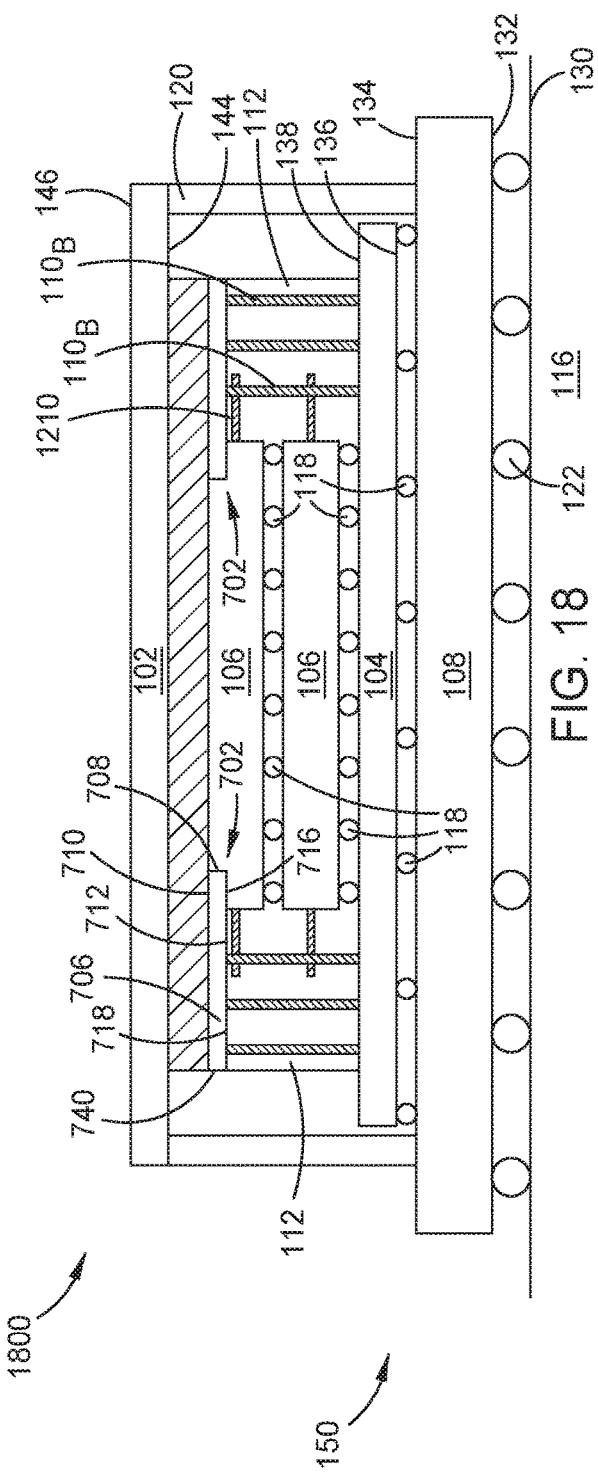

STACKED SILICON PACKAGE ASSEMBLY HAVING THERMAL MANAGEMENT

TECHNICAL FIELD

Embodiments of the present invention generally relate to a chip package assembly, and in particular, to a chip package assembly comprising at least one integrated circuit (IC) die disposed on a package substrate or interposer, and a plurality of heat transfer structures contacting the IC die that are disposed outward of the functional circuitry of the IC die.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices.

In many chip package assemblies, providing adequate thermal management has become increasingly challenging. Failure to provide adequate cooling often results in diminished service life and even device failure. Thermal management is particularly problematic in applications where multiple dies are vertically stacked on a substrate in a single package assembly. In such applications, the IC dies that are located closer to the substrate often have poor heat transfer paths out of the package assembly. The lack of efficient paths to remove heat from these middle and lower positioned IC dies of the vertical IC stack often causes these dies to operate at temperatures very close to the thermal junction temperature limit. Thus, small fluctuations in ambient temperatures, such as by air conditioner failure, may quickly lead to the thermal junction temperature limit being exceeded, resulting in device failure or system shutdowns.

Therefore, a need exists for a chip package assembly having improved thermal management.

SUMMARY

A chip package assembly and method for fabricating the same are provided which utilize a plurality of electrically floating heat transfer structures for improved thermal management. In one example, a chip package assembly is provided. The chip package assembly includes a substrate, a first integrated circuit (IC) die and a plurality of electrically floating conductive heat transfer structures. The substrate has a first surface and an opposing second surface. The first IC die has a first surface, an opposing second surface, and four lateral sides. The second surface of the first IC die is mounted to the first surface of the substrate. The plurality of electrically floating conductive heat transfer structures extend in a first direction defined between the first and second surfaces of the first IC die. A first conductive heat transfer structure of the plurality of electrically floating conductive heat transfer structures are part of a first conductive heat transfer path having a length in the first direction at least as long as a distance between the first and second surfaces.

In another example, a chip package assembly is provided that includes a first integrated circuit (IC) die, a first heat transfer structure, a second IC die, a second heat transfer structure and a third heat transfer structure. The second IC die is mounted to the first IC die. The first heat transfer structure is disposed on a first side of the first IC die, and fabricated from a metalization layer of the first IC die. The second heat transfer structure is disposed on a first side of the second IC die, and fabricated from a metalization layer of the second IC die. The third heat transfer structure connects the first heat transfer structure to the second heat transfer structure.

In another example, a chip package assembly is provided that includes a first integrated circuit (IC) die, a conductive member and a first plurality of heat transfer structures. The substrate has a first surface and an opposing second surface. The first IC die has a first surface and an opposing second surface. The second surface of the first IC die is mounted to the first surface of the substrate. The first surface of the first IC die has a recess formed along at least one edge. The conductive member is disposed in the recess. The first plurality of electrically floating heat transfer structures extend parallel to a side of the first IC die and are coupled to the conductive member.

In another example, a chip package assembly is provided that includes a substrate, a first integrated circuit (IC) die, a first plurality of electrically floating heat transfer structures, a second IC die, a second plurality of electrically floating heat transfer structures, and a third plurality of conductive heat transfer structures coupling the first plurality of electrically floating heat transfer structures to the second plurality of electrically floating heat transfer structures. The substrate has a first surface and an opposing second surface. The first IC die has a first surface and an opposing second surface. The second surface of the first IC die is mounted to the first surface of the substrate. The first plurality of electrically floating heat transfer structures are formed from metalization layers of the first IC die. The second IC die have a first surface and an opposing second surface. The second surface of the second IC is mounted above the first surface of the first IC die. The second plurality of electrically floating heat transfer structures are formed from metalization layers of the second IC die.

In another example, a chip package assembly is provided that includes a substrate, a first integrated circuit (IC) die, a second IC die, and a first electrically floating heat transfer structures. The substrate has a first surface and an opposing second surface. The first IC die has a first surface and an opposing second surface. The second surface of the first IC die is mounted to the first surface of the substrate. The second IC die has a first surface and an opposing second surface. The second surface of the second IC is mounted above the first surface of the first IC die. The first electrically floating heat transfer structure extends laterally out between the first IC die and the second IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic sectional view of a chip package assembly having a plurality of heat transfer structures disposed around integrated circuit (IC) dies.

FIG. 2 is a schematic top view of an IC die of the chip package assembly of FIG. 1 revealing an exemplary geometric arrangement of the heat transfer structures disposed around the border area of the IC die.

FIG. 3 is a schematic partial sectional view of the IC die of FIG. 2 taken through one of the heat transfer structures disposed through the border area of the IC die.

FIGS. 10-12 are schematic sectional views of other examples of chip package assemblies having a plurality of heat transfer structures disposed around integrated circuit (IC) dies.

FIGS. 17-18 are schematic sectional views of other examples of chip package assemblies having a plurality of heat transfer structures disposed around integrated circuit (IC) dies.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 4:
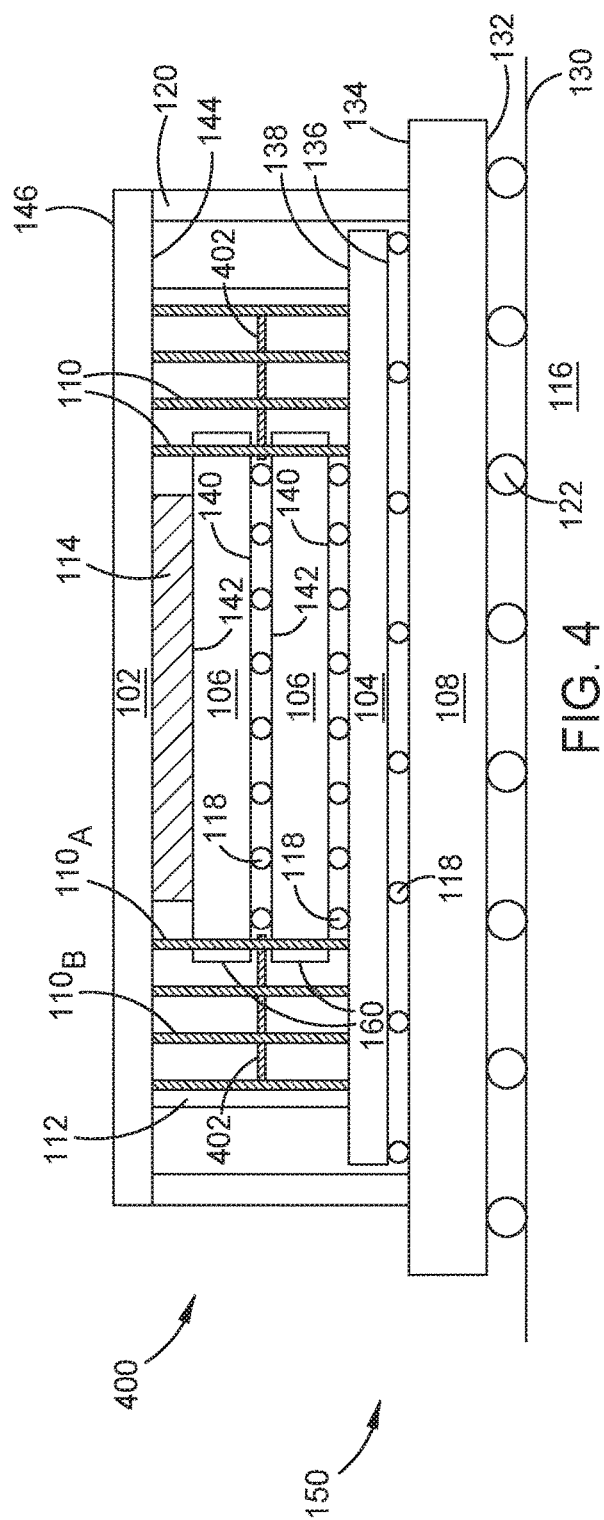
FIG. 4 is a schematic sectional view of another example of a chip package assembly having a plurality of heat transfer structures disposed around integrated circuit (IC) dies.

A chip package assembly and method for fabricating the same are provided which utilize a plurality of electrically floating heat transfer structures configured to remove heat from the integrated circuit (IC) dies. The chip package assembly described herein includes at least one integrated circuit (IC) die disposed on a substrate. The substrate may be a package substrate or an interposer. The heat transfer structures provide robust heat transfer paths vertically, and in some instances laterally, away from the IC die. Advantageously, the enhanced heat transfer vertically out of the chip package assembly improves reliability and performance. Furthermore, the heat transfer structures may be arranged to enhance heat transfer across the entirety of the chip package assembly, for example by using more structures on one region relative to another, thus reducing hot spots which could induce warpage or provide insufficient temperature control of the IC dies. Furthermore, structures that provide lateral heat transfer from the IC dies allow heat to be channeled away from IC dies that underlay another IC die with minimal heating of the overlaying IC die. Advantageously, the ability of the heat transfer structures to remove heat from IC dies positioned in the middle and bottom of a vertical stack of IC dies significantly reduces thermal coupling and temperature rise within the interior of chip packages assembly, which advantageously improves electromigration (EM) lifetime.

Turning now to FIG. 1, a schematic sectional view of a chip package assembly 100 having a plurality of heat transfer structures providing efficient heat transfer paths away from one or more integrated circuit (IC) dies 106 is illustrated. The heat transfer paths through the chip package assembly 100 are generally defined by the heat transfer structures, either by a singular heat transfer structure and alternatively as one heat transfer structure directly contacts another heat transfer structure. In some embodiments, the thermal connection between adjacent heat transfer structures may be made through a small amount of dielectric filler or thermal interface material (TIM) as later described below. The heat transfer structures of FIG. 1 are collectively referred to utilizing reference numeral 110, and are illustrated as heat transfer structures $110_A$ and heat transfer structures $110_B$ in the example of FIG. 1. The chip package assembly 100 also includes a cover 102, an interposer 104 and a package substrate 108.

Although two IC dies 106 are shown in FIG. 1, the total number of IC dies may range from one to as many as can be fit within the chip package assembly 100. The use of heat transfer structures 110 is particularly advantageous in configurations where dies 106 further from the cover 102, which conventionally are at risk to operate at or near the maximum operating temperatures, have the same or smaller projected area than an overlaying die 106 (i.e., a die closer to the cover 102), thus allowing the heat transfer structures 110 to be in contact with the underlying die 106 without the overlaying die 106 blocking an efficient heat transfer path to the cover 102. Examples of IC dies 106 that may be utilized in the chip package assembly 100 include, but are not limited to, programmable logic devices, such as field programmable gate arrays (FPGA), memory devices, such as high bandwidth memory (HBM), optical devices, processors or other IC logic structures. One or more of the IC dies 106 may optionally include optical devices such as photo-detectors, lasers, optical sources, and the like.

Each IC die 106 includes a bottom surface 140 disposed opposite a top surface 142. The bottom and top surfaces 140, 142 do not necessarily represent the active and substrate sides of the dies 106. It is intended that the bottom surface 140 of one die 106 mounted to the top surface 142 of a second IC die 106 may result in the active sides of each die 106 facing the same direction, or facing opposite directions. For example, the active side of one die 106 may be directly mounted to the active side of the adjacent die 106.

The top surface 142 of the upper most IC die 106 faces the cover 102, while the bottom surface 140 of the upper most IC die 106 faces the top surface 142 of the lower most IC die 106. Contact pads exposed on the bottom surface 140 of the die 106 are coupled to contact pads exposed on the top surface 142 of the adjacent underlying IC die 106 by solder connections 118 or other suitable electrical connection, such as a hybrid connecter comprised of metal circuit connection material disposed in a dielectric sheet.

The top surface 142 of the upper most IC die 106 is adjacent to the cover 102, while the bottom surface 140 of the lower most IC die 106 is adjacent to the interposer 104. The bottom surface 140 of the lower most die 106 is coupled to a top surface 138 of the interposer 104 by solder connections 118 or other suitable electrical connection. The top surface 142 of the upper most die 106 faces a bottom surface 144 of the cover 102. Thermal interface material (TIM) 114 may be disposed between the top surface 142 of the upper most IC die 106 (i.e., the die 106 closest the cover 102) and the bottom surface 144 of the cover 102 to enhance heat transfer therebetween. In one example, the TIM 114 may be a thermal gel or thermal epoxy, such as, packaging component attach adhesives.

In some implementations, the cover 102 is fabricated from rigid material. In other implementations particularly where it is desirable to utilize the cover 102 to receive heat transmitted from the IC dies 106 through the structures 110, the cover 102 is fabricated from a thermally conductive material, such as stainless steel, copper, nickel-plated copper or aluminum, among other suitable materials. A heat sink, not shown, may optionally be mounted to a top surface 146 of the cover 102. In such implementations, the thermally conductive cover 102, along with the connecting heat transfer structure $110_A$, $110_B$, may be consider part of the heat transfer path out of the chip package assembly 100.

The cover 102 may be structurally coupled to the package substrate 108 to increase the rigidity of the chip package assembly 100. Optionally, a stiffener 120 may be utilized to structurally couple the cover 102 to the package substrate 108. When used, the stiffener 120 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 120 can also be made of organic materials such as copper-clad laminate.

Functional circuitry of the IC dies 106 is connected to the circuitry of the interposer 104 through the solder connections 118. The circuitry of the interposer 104 is similarly connected to the circuitry of the package substrate 108. In the example depicted in FIG. 1, a bottom surface 136 of the interposer 104 is electrically and mechanically coupled to a top surface 134 of the package substrate 108 by solder connections 118 or other suitable connection.

The chip package assembly 100 may be mounted to a printed circuit board (PCB) 116 to form an electronic device 150. In this manner, the circuitry of the package substrate 108 is coupled to the circuitry of the package substrate 108 via solder balls 122, or other suitable connection. In the example depicted in FIG. 1, a bottom surface 132 of the package substrate 108 is electrically and mechanically coupled to a top surface 130 of the PCB by the solder balls 122.

Dielectric filler 112 is disposed on the interposer 104 and at least partially laterally circumscribes the dies 106. The dielectric filler 112 may also encapsulate the dies 106 against the interposer 104. The dielectric filler 112 provides additional rigidity to the chip package assembly 100, while also protecting the solder connections 118 between the IC dies 106. The dielectric filler 112 may be an epoxy-based material or other suitable material. The dielectric filler 112 may additionally include fillers, for example, inorganic fillers such as silica ($SiO_2$). In one example, the dielectric filler 112 may have a CTE between about 20 to about 40 ppm/degree Celsius, a viscosity of between about 5 to about 20 Pascal-seconds, and a Young's modulus of between about 6 to about 15 gigapascal (GPa).

In one example, the dielectric filler 112, prior to curing, has a viscosity suitable to flow into and fill the interstitial space between the bottom surface 140 of the dies 106 and the top surface 138 of the interposer 104 around the solder connections 118. Alternatively, a separate underfill material may be used to fill the interstitial space the bottom surface 140 of the dies 106 and the top surface 138 of the interposer 104 around the solder connections 118, while the dielectric filler 112 is disposed over the underfill and fills the interstitial space between adjacent dies 106.

As discussed above, heat transfer structures 110 are provided to provide robust conductive heat transfer paths between away from the at least one IC die 106, and in some examples, to the bottom surface 144 of the cover 102. TIM may be utilized between the structures 110 and the cover 102 to provide a robust heat transfer interface between the structures 110 and the bottom surface 144 of the cover 102. In the example, heat transfer structures $110_A$ are illustrated disposed through the IC dies 106 while heat transfer structures $110_B$ are illustrated disposed through the dielectric filler 112. It is contemplated that heat transfer structures $110_A$ may be utilized with or without heat transfer structures $110_B$, heat transfer structures $110_B$ may be utilized with or without heat transfer structures $110_A$.

FIG. 2 depicts a sectional view of one of the IC dies 106 with heat transfer structures $110_A$ formed therethrough. The IC die 106 includes an active circuit area 206 that contains all of the functional circuitry 204 of the die 106. A border area 208 is defined between the active circuit area 206 and the sides 160 of the die 106. The border area 208 generally does not contain any of the functional circuitry 204.

Holes 210 are formed through the IC die 106 in the border area 208. The holes 210 may be formed through the die 106 by etching, laser drilling, drilling or other suitable technique. Each hole 210 has one of the heat transfer structures $110_A$ disposed therein. The hole 210, and consequently the heat transfer structures $110_A$, have an axial orientation that is substantially parallel to the plane of the sides 160 of the dies 106, and substantially perpendicular to a plane of the top surface 142 of the IC die 106. Although holes 210 filled with heat transfer structures $110_A$ are illustrated on opposite sides of the die 106, one or more holes 210 filled with heat transfer structures $110_A$ may alternatively be disposed one, three or even four sides 160 of the die 106.

The heat transfer structures $110_A$ are generally a metal or other highly thermally conductive material. For example, the heat transfer structures $110_A$ may be formed from copper or other suitable metal. Alternatively, the heat transfer structures $110_A$ may be fabricated from a high heat transfer rate object, as further described below. The structure $110_A$ may be disposed in the hole 210 directly in contact with the IC die 106 in which the hole 210 is formed. Alternatively, one or more of the heat transfer structures $110_A$ may be formed from thermally conductive powder, metal wool, discrete metal shapes, solder paste, metal fibers, metal powder, metal particles, metal balls, and thermally conductive adhesive. In one example, thermally conductive material forming the heat transfer structures $110_A$ is a metal, such as copper, gold, silver, titanium or other suitable metal. In another example, the thermally conductive material is comprised of a plurality of copper balls that fill the hole 210 formed through the die 106. In yet another, the thermally conductive material is comprised of a bulk metal plated or otherwise deposited on a seed layer. For example, the bulk metal may be copper plated on a copper or titanium seed layer. In still another, the interstitial space between the copper balls (or other conductive material filling the hole in the structures 110) may be filed TIM or other heat transfer material.

Alternatively as mentioned above, one or more of the heat transfer structures $110_A$ utilized on the chip package assembly 100 may be in the form of a high heat transfer rate object configured to provide a high rate of heat transfer rate between ends of the object. The high heat transfer rate object uses super thermal conductive properties to move heat between the ends of the object. The high heat transfer rate object can include either (1) vibrating and contacting particles within the object to transfer the heat, such as industrial diamonds, or (2) moving particles within the object by providing two passive flows functionality, such as heat pipes, or (3) moving particles with forced flow movement by introduced fluid circulation within the object which will pumped from external object (i.e. pump outside the package).

The heat transfer structures $110_A$ may have any suitable sectional profile, and generally have a length that is about the same as the height of the die 106. In one example, the sectional profile of the structure $110_A$ is circular. The number, size, density and location of the structures $110_A$ may be selected to provide a desired heat transfer profile through the die 106, for example, to compensate for one region of the die 106 producing more heat than another portion of the die 106. The number of structures $110_A$ disposed in the border area 208 may be from one to as many as desired. The location, size and density of the structures $110_A$ may be selected to enhance heat transfer in desired locations, and to control the warpage of the chip package assembly 100. Although not required, the structures $110_A$ generally have axial an orientation that is perpendicular to a plane of the top surface 142 of the IC die 106.

The heat transfer structures $110_A$ generally extend at least to the top surface 142 of IC die 106. In some examples, the structures $110_A$ extend beyond the top surface 142 of IC die 106 and may be in direct contact with the bottom surface 144 of the cover 102. Optionally, thermal connection between the structures $110_A$ and the bottom surface 144 of the cover 102 may be made using TIM 114. The heat transfer structures $110_B$ may be similarly configured.

Generally, the each of the heat transfer structures $110_A$, $110_B$ which form the conductive heat transfer paths have a length in a first direction defined between the top and bottom surfaces 140, 142 that is at least as long as a distance between the top and bottom surfaces 140, 142 of a single die. In some instances, the heat transfer structures $110_A$, $110_B$ which form conductive heat transfer paths across an entire stack of dies have a length in the first direction that is at least as long as a distance between the top surface 142 of the upper most die 106 and the bottom surface 140 of the lower most die 106 in the stack of dies 106 comprising the chip package assembly 100.

Referring additionally to the partial sectional view of two dies 106 of the chip package assembly 100 depicted in FIG. 3, the heat transfer structures $110_A$ of one the IC die 106 may be connected to the heat transfer structures $110_A$ of another the IC die 106. For example, the heat transfer structures $110_A$ of two stacked the IC dies 106 may be connected to each other via solder or other conductive connection, or a single heat transfer structure $110_A$ may extend through two or more stacked the IC dies 106. For example, the holes 210 may be filled with conductive material after the IC dies 106 are stacked, making a singular heat transfer structure $110_A$ in the form of a post extending through aligned holes 210 of the each of the stacked the IC dies 106.

As the heat transfer structures $110_A$ are disposed in the border area 208 disposed outward of the active circuit area 206, the heat transfer structures $110_A$ are clear of the solder connections 118 coupling the functional circuities 204 of the two IC dies 106. Optionally, the solder connections 118 may be a hybrid bond that utilizes metals bonding to metals and dielectric bonding to dielectric to connect the functional circuities 204 of the two IC dies 106.

Returning back now to FIG. 1, optional additional heat transfer structures $110_B$ may be present extending through holes 170 formed through the dielectric filler 112 to provide conductive heat transfer paths extending vertically through the chip package assembly 100. The heat transfer structures $110_B$ conduct heat exiting the sides 160 of the IC dies 106 through the filler 112 to the bottom surface 144 of the cover 102. TIM may be utilized between the heat transfer structures $110_B$ and the cover 102 to provide a robust heat transfer interface between the structures 110 and the bottom surface 144 of the cover 102. The heat transfer structures $110_B$ may be fabricated from the same materials utilized to fabricate the heat transfer structures $110_A$.

The holes 170 may be formed through the dielectric filler 112 by etching, laser drilling, drilling or other suitable technique, then filled with the heat transfer structures $110_B$. Alternatively, the heat transfer structures $110_B$ may be positioned or formed first on the top surface 138 of the interposer 104, with the dielectric filler 112 deposited around the heat transfer structures $110_B$. The heat transfer structures $110_B$ may have any suitable sectional profile, and generally have a length that is about the same as or longer than the height of the die 106. In one example, the sectional profile of the structure $110_B$ is circular. The number, size, density and location of the structures $110_B$ may be selected to provide a desired heat transfer profile between the cover 102 and the interposer 104, for example, to compensate for one die 106 producing more heat than another die 106. Although not required, the structures $110_B$ generally have axial an orientation that is perpendicular to a plane of the top surface 142 of the IC die 106.

The heat transfer structure $110_B$, and thus the heat transfer paths, generally have a length that is equal to or greater than a thickness of the IC die 106. Some structures may have a length that is equal to or greater than a sum of the thicknesses of the IC dies 106 disposed between the interposer 104 and the cover 102. The number of structures $110_B$ disposed through the dielectric filler 112 may be from one to as many as desired. The location, size and density of the structures $110_B$ may be selected to enhance heat transfer in desired locations, and to control the warpage of the chip package assembly 100.

FIG. 4 is a schematic sectional view of another chip package assembly 400 having a plurality of heat transfer structures providing efficient heat transfer paths away from one or more integrated circuit (IC) dies 106. The chip package assembly 400 is essentially the same as the chip package assembly 100 described above, except wherein a heat transfer structure 402 is disposed between the dies 106, and extends laterally outward beyond the sides 160 of the dies 106 into the dielectric filler 112. In the example of FIG. 4 at least one heat transfer structure $110_A$ and/or at least one heat transfer structures $110_B$ may optionally be utilized with the heat transfer structure 402 as further described below. As the 100 series reference numerals identify the elements of the chip package assembly 400 shown in FIG. 4 that have previously described above with reference to FIG. 1, further description of these elements has been omitted for the sake of brevity.

As described above, the heat transfer structure 402 is disposed between the dies 106. The heat transfer structure 402 may be in the form of a metal foil, metal mesh or other thin thermal conductor having a thickness less that the solder connection 118 or hybrid connection utilized to secure and electrically connect the dies 106. In the example depicted in FIG. 4, the heat transfer structure 402 projects out from between the dies 106 in an orientation that is substantially parallel to the top surface 142 of the dies 106. Alternatively, the heat transfer structure 402 may project out from between the dies 106 in another orientation, for example, be folded upward along the side 160 of the die 106 immediately above the structure 402. Optionally, TIM (not shown) may be disposed between the heat transfer structure 402 and the top and bottom surfaces 140, 142 of the dies 106 sandwiching the structure 402.

In one example, a single heat transfer structure 402 may be utilized on only one side 160 of the die 106. In other examples, a single heat transfer structure 402 may be utilized on two, three or sides 160 of the die 106. In yet other examples, multiple heat transfer structures 402 may be utilized one, two, three or sides 160 of the die 106.

Figure 5:
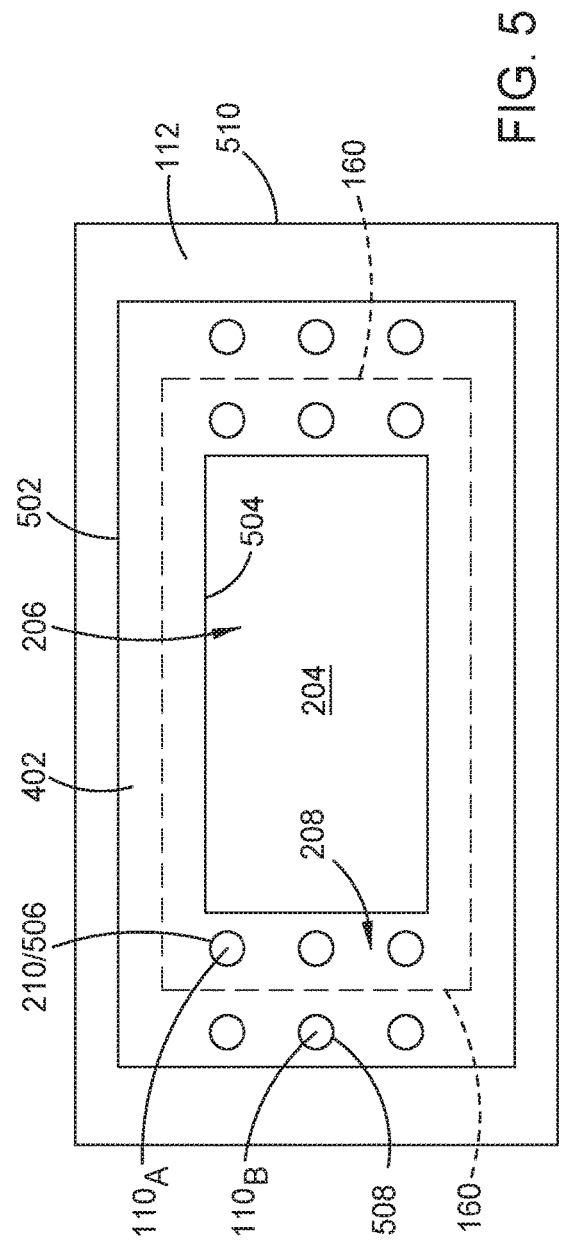
FIGS. 5-6 are schematic sectional views of various alternative examples of heat transfer structures that may be utilized in the chip package assembly of FIG. 4, among others.

FIG. 5 depicts a plan view of one example of the heat transfer structure 402 disposed on a top surface 142 of a die 106. The heat transfer structure 402 has a ring shape, and may be comprised of one or more segments. In the example of FIG. 5, the heat transfer structure 402 includes an inner wall 504 and an outer wall 502. The inner wall 504 bounds the aperture formed by the ring-shaped heat transfer structure 402. The inner wall 504 bounds an area that is smaller than an area bounded by the sides 160 of the die 106. Stated differently, the inner wall 504 is inward of the sides 160 of the die 106 while the outer wall 502 is outward of sides 160 of the die 106. Although not required, the inner wall 504 terminates prior to the active circuit area 206 of the die 106 in which the solder connections 118 (not shown in FIG. 5) are present. In this manner, the heat transfer structure 402 overlaps at least a portion of the border area 208 while also extending beyond the sides 160 of the die 106 into the dielectric filler 112, while not electrically connecting to any of the solder connections 118. Although not required, the outer wall 502 terminates inward of an outer edge 510 of the dielectric filler 112.

When utilized, the heat transfer structures 110$_A$ are coupled to the heat transfer structure 402. Thus, the heat transfer structure 402 efficiently removes heat from between the dies 106 and conducts the removed heat to the heat transfer structures 110$_A$, which readily transfers heat from the heat transfer structure 402 vertically out of the chip package assembly 100, for example, to the cover 102. The heat transfer structures 110$_A$ may be coupled to the heat transfer structure 402 by forming holes 506 through the heat transfer structure 402 and that align with the holes 210 formed through one or more of the dies 106, then filling the holes 210, 506 with the heat transfer structures 110$_A$. Alternatively but not by way of limitation, the heat transfer structure 402 may extend into the hole 210, 506, and the heat transfer structures 110$_A$ be formed on the portion of the heat transfer structure 402 exposed within the hole 210.

When utilized with or without heat transfer structures 110$_A$, the heat transfer structures 110$_B$ may be coupled or not coupled to the heat transfer structure 402. In the example of FIG. 5, the heat transfer structures 110$_B$ are coupled to the heat transfer structure 402. The heat transfer structures 110$_B$ improves the efficiency and speed that heat can be removed from between the dies 106 utilizing the heat transfer structure 402 by increasing the area of the heat transfer paths vertically out of the chip package assembly 100. The heat transfer structures 110$_B$ may be coupled to the heat transfer structure 402 by forming holes 508 through the heat transfer structure 402 that align with the holes 170 (shown in FIG. 1) formed through the dielectric filler 112, then filling the holes 170, 508 with the heat transfer structures 110$_B$. Alternatively but not by way of limitation, the heat transfer structure 402 may extend into the hole 170, and the heat transfer structures 110$_B$ be formed on the portion of the heat transfer structure 402 exposed within the hole 170.

Figure 6:
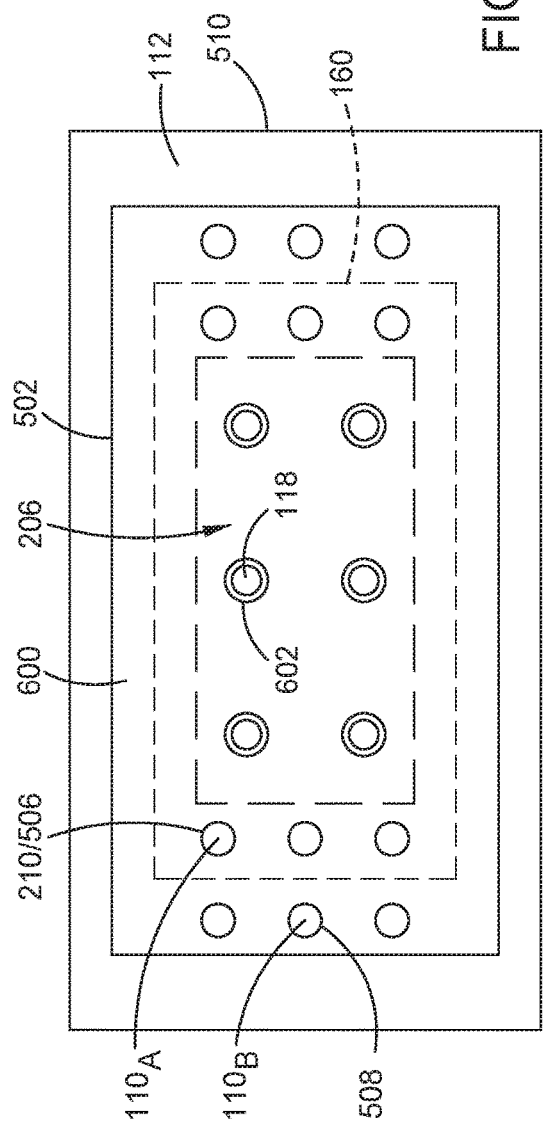

FIG. 6 depicts another embodiment of a heat transfer structure 600 that may be utilized in place of the heat transfer structure 402 illustrated in FIG. 4. The heat transfer structure 600 is essentially the same as the heat transfer structure 402, except wherein the heat transfer structure 600 extend over the active circuit area 206. The heat transfer structure 600 may optionally have a ring shape having an inner wall 504 (as present on the heat transfer structure 402 depicted in FIG. 5), or be a continuous sheet of material.

In the example of FIG. 6, the portion of the heat transfer structure 600 extending across the active circuit area 206 includes a plurality of apertures 602. Each aperture 602 is aligned with a corresponding one of the solder connections 118. The apertures 602 have a diameter greater than a diameter of the solder connections 118 to prevent electrical shorting between the solder connections 118.

The heat transfer structure 600 may be utilized with or without either or both of the heat transfer structures 110$_A$, 110$_B$.

Figure 7:
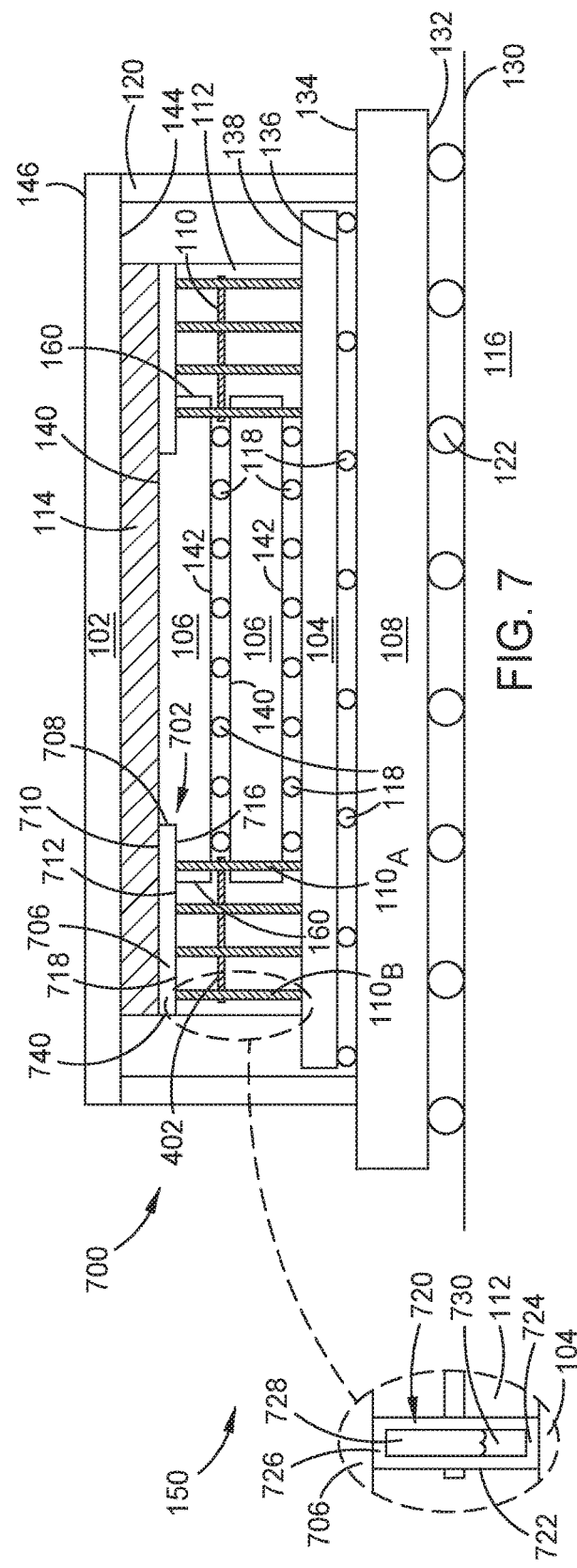
FIGS. 7-8 are schematic sectional views of other examples of chip package assemblies having a plurality of heat transfer structures disposed around integrated circuit (IC) dies.

FIG. 7 a schematic sectional view of another chip package assembly 700 having at least one heat transfer structure providing efficient heat transfer paths away from one or more integrated circuit (IC) dies 106. The chip package assembly 700 is essentially the same as the chip package assembly 400 described above, except wherein a heat transfer structure 706 is disposed in a recess 702 formed between the top surface 142 of the die 106 closest the cover 102 and the cover 102. The heat transfer structure 706 is in contact with the die 106 and extends laterally outward beyond the sides 160 of the upper most die 106 (i.e., die 106 closest the cover 102). In the example of FIG. 4, one or more of the heat transfer structures 110$_A$, the heat transfer structures 110$_B$, and/or the heat transfer structures 402, 600 may optionally be utilized with the heat transfer structure 706 as further described below. As the 100, 400 series reference numerals identify the elements of the chip package assembly 700 shown in FIG. 7 that have previously described above with reference to FIGS. 1 and 4, further description of these elements has been omitted for the sake of brevity.

As discussed above, the top surface 142 of the IC die 106 closest the cover 102 includes a recess 702 formed along at least one edge defined at the intersection of the side 160 and the top surface 142 of the IC die 106, which is configured to accept a heat transfer structure 706 disposed in the recess 702. The heat transfer structure 706 may optionally be connected to one or more of the heat transfer structures 110$_A$, the heat transfer structures 110$_B$ extending upward within the die 106 and dielectric filler 112.

In the example of FIG. 7, the heat transfer structure 706 is a thermally conductive plate, foil, mesh and other suitable thermally conductive structure. For example, the heat transfer structure 706 may be a metal plate, such as a gold, silver, titanium or copper. The heat transfer structure 706 has an inner edge 708 that overlaps the side 160 of the upper most IC die 106, i.e., the IC die closest the cover 102. The heat transfer structure 706 may extend from the inner edge 708 to an outer edge 740 to increase the heat transfer area available to conduct heat between the structure 706 and the cover 102, ultimately improving the heat transfer efficiency away from the upper most die 106.

In one example, the heat transfer structure 706 has a ring shape. When having a ring shape, the inner edge 708 of the heat transfer structure 706 is overlaps all four sides 160 of the upper most IC die 106. Stated differently, the inner edge 708 of the heat transfer structure 706 resides in the portions of the recess 702 formed in each of the four sides 160 of the upper most IC die 106. Alternatively, the inner edge 708 of the heat transfer structure 706 may reside in the recess 702 in only one, two or three sides 160 of the upper most IC die 106.

The heat transfer structure 706 includes a top surface 710 and a bottom surface 712. The top surface 710 of the heat transfer structure 706 faces the cover 102. In the example depicted in FIG. 7, TIM 114 is disposed between the top surface 710 of the heat transfer structure 706 and the bottom surface 144 of the cover 102 to enhance heat transfer therebetween. An inner portion 716 of the bottom surface 712 of the heat transfer structure 706 is in contact with the recess 702 formed in the IC die 106 and from the upper ends of the heat transfer structure $110_A$ when utilized. An outer portion 718 of the bottom surface 712 of the heat transfer structure 706 is in contact with the dielectric filler 112. The outer portion 718 of the bottom surface 712 of the heat transfer structure 706 provides a surface to receive heat transferred to the heat transfer structure 706 from the upper ends of the heat transfer structures $110_B$, when utilized. The heat transfer structures 402, 600 may also optionally be utilized with one or both of the structures $110_A$, $110_B$ to increase the overall efficiency of heat transfer way from the dies 106, and particularly, dies 106 farthest from the cover 102 which may be "insulated" by intervening dies 106 closer to the cover 102.

The heat transfer structure $110_A$, $110_B$, 402, 600 may be fabricated as described above or by another suitable technique. The structures $110_A$, $110_B$, 402, 600 may be disposed in contact with the heat transfer structure 706 on all sides 160 of the die 106. Alternatively the structures $110_A$, $110_B$, 402, 600 may be disposed in contact with the heat transfer structure 706 on at least one pair of opposing sides 160 of the IC die 106. In yet another example, the structures $110_A$, $110_B$, 402, 600 may be disposed in contact with the heat transfer structure 706 on at least one or three sides 160 of the upper most IC die 106. Generally, the structures $110_B$, 402, 600 are laterally surrounded by the dielectric filler 112.

Alternatively, one or more of the heat transfer structures $110_A$, $110_B$ utilized on the chip package assemblies described herein is in the form of an object configured to provide a high rate of heat transfer rate between ends of the object. The high heat transfer rate object uses super thermal conductive properties to move heat between the ends of the object. The high heat transfer rate object can include either (1) vibrating and contacting particles within the object to transfer the heat, such as industrial diamonds, or (2) moving particles within the object by providing two passive flows functionality, such as heat pipes, or (3) moving particles with forced flow movement by introduced fluid circulation within the object which will pumped from external object (i.e. pump outside the package).

In the example depicted in FIG. 7, one or more of the one or more of the heat transfer structures $110_A$, $110_B$ is configured as a high heat transfer rate object in the form of a heat pipe 720. The heat pipe 720 includes a sealed tube 722 having a first end 724 and a second end 726. The tube 722 includes a sealed cavity 728 in which a phase change material 730 is disposed. In operation, the phase change material 730 in a liquid phase in contact with a thermally conductive solid surface, i.e., the first end 724 of the tube 722, turns into a vapor by absorbing heat transferred from one of the dies 106. For example, the first end 724 of the tube 722 may receive heat transferred laterally outward from the dies 106 the heat transfer structure 402, 600. The vapor (e.g., the phase change material 730) then travels between the first end 724 of the tube 722 inside the cavity 728 to the cold interface, i.e., the second end 726 of the tube 722, and condenses back into a liquid—releasing the latent heat into the cover 102 through the TIM 114, as shown in FIG. 1, or releasing the latent heat into the heat transfer structure 706 and eventually to the cover 102 through the TIM 114, as shown in FIG. 7. The phase change material 730 in liquid form then returns to the hot interface at the first end 724 of the tube 722 through capillary action and/or gravity, and the cycle repeats. Due to the very high heat transfer coefficients for boiling and condensation, the heat transfer structure in the form of a heat pipe 720 is highly effective for conducting heat away from the dies 106 that are farther from the bottom surface 144 of the cover 102, which advantageously improves the heat transfer performance of the chip package assemblies described herein.

Figure 8:
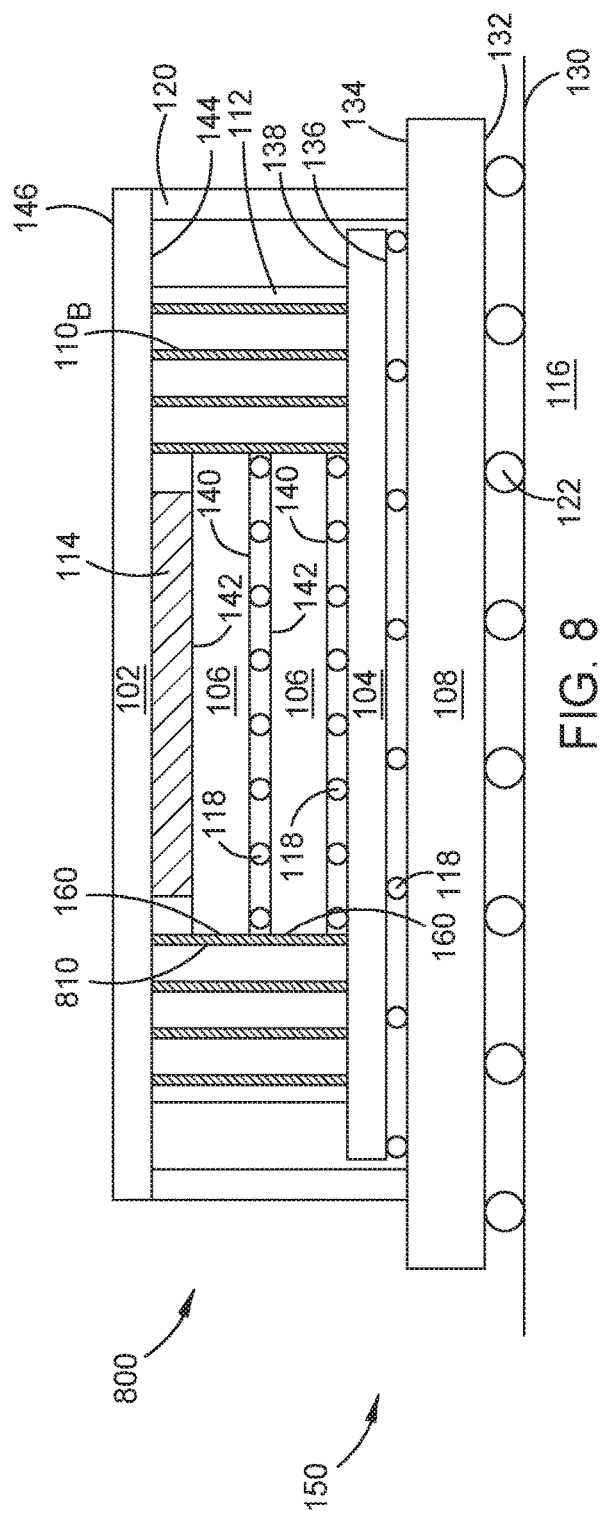

FIG. 8 is a schematic sectional view of another chip package assembly 800 having at least one heat transfer structure providing efficient heat transfer paths away from one or more integrated circuit (IC) dies 106. The chip package assembly 800 is essentially the same as the chip package assembly 100 described above, except wherein one or more heat transfer structures 810 is disposed in contact with one or more sides 160 of the die 106. In the example of FIG. 8, one or more of the heat transfer structures $110_A$, the heat transfer structures $110_B$, and/or the heat transfer structures 402, 600 (as shown in FIGS. 4-5) may optionally be utilized with the heat transfer structure 810. In the example depicted in FIG. 8, only the optional heat transfer structures $110_B$ are shown utilized along with heat transfer structures 810. As the 100 series reference numerals identify the elements of the chip package assembly 800 shown in FIG. 8 that have previously described above with reference to FIG. 1, further description of these elements has been omitted for the sake of brevity.

As described above, the heat transfer structures 810 are disposed in contact with the sides 160 of the dies 106. The heat transfer structure 810 may be in the form of a metal foil, metal mesh, conductive paste, conductive adhesive, metal plating, metal coating, other thin thermal conductor. In the example depicted in FIG. 8, the heat transfer structure 810 covers the sides 160 of the dies 106 in an orientation that is substantially perpendicular to the top surface 142 of the dies 106, and of course, parallel to the sides 160.

In one example, a single heat transfer structure 810 may be utilized on only one side 160 of the die 106. In other examples, a single heat transfer structure 810 may be utilized on two, three or sides 160 of the die 106. In yet other examples, multiple heat transfer structures 810 may be utilized one, two, three or sides 160 of the die 106.

Figure 9:
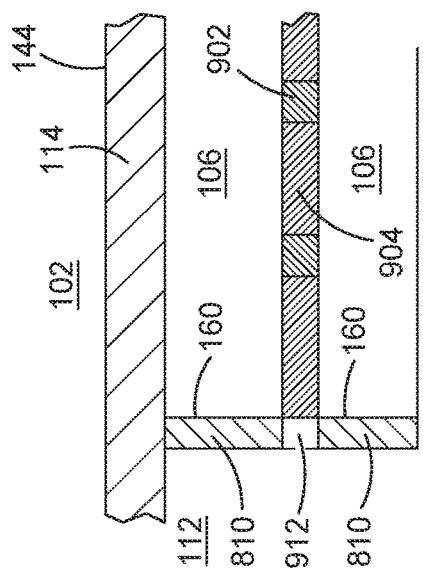
FIG. 9 is a schematic sectional view of one example of a heat transfer structure that may be utilized in the chip package assembly of FIG. 8, among others.

FIG. 9 is a partial sectional view of two dies 106 of the chip package assembly 800 illustrating the heat transfer structures 810 on one side 160 of the dies 106. In the example of FIG. 9, the solder connections 118 securing the dies 106 is shown as a hybrid bond having metals bonding to metals and dielectric bonding to dielectric to connect the functional circuities 204 of the stacked IC dies 106.

A single heat transfer structure 810 may be utilized on one, two, three or sides 160 of the die 106. In yet other examples, multiple heat transfer structures 810 may be utilized one, two, three or sides 160 of the die 106. In the example illustrated in FIG. 9, each side 160 of the die 106 has an individual and separate heat transfer structure 810. The heat transfer structure 810 may be spaced apart and separated by a dielectric material, either from the hybrid bond or dielectric filler, or thermally coupled via a thermally conductive jumper 912. The thermally conductive jumper 912 may be a metal, such as from the hybrid bond, solder connection, TIM, or other good thermal conductor. Alternatively, a single heat transfer structure 810 may vertically span across the stacked adjacent sides 160 of two vertically stacked dies 106, as shown in FIG. 8.

FIG. 10 is a schematic sectional view of another chip package assembly 1000 having at least one heat transfer structure providing efficient heat transfer paths away from one or more integrated circuit (IC) dies 106. The chip package assembly 1000 is essentially the same as the chip package assembly 800 described above, except wherein one or more heat transfer structures 402, 600 disposed between the dies 106 are in contact with the one or more heat transfer structures 810 contacting the sides 160 of the dies 106. In the example of FIG. 8, one or more of the heat transfer structures $110_A$ and the heat transfer structures $110_B$, may optionally be utilized with the heat transfer structure 810. In the example depicted in FIG. 10, only the optional heat transfer structures $110_B$ are shown utilized along with heat transfer structures 810. Redundant descriptions of certain elements of the chip package assembly 1000 shown in FIG. 10 that have previously described above with reference to the prior Figures has been omitted for the sake of brevity.

As described above, the heat transfer structure 402, 600 is disposed between the dies 106. The heat transfer structure 402, 600 may be in the form of a metal foil, metal mesh or other thin thermal conductor having a thickness less that the solder connection 118 or hybrid connection utilized to secure and electrically connect the dies 106. In the example depicted in FIG. 10, the heat transfer structure 402, 600 projects out from between the dies 106 in an orientation that is substantially parallel to the top surface 142 of the dies 106. Alternatively, the heat transfer structure 402, 600 may project out from between the dies 106 in another orientation, for example, be folded upward over the heat transfer structure 810 covering the side 160 of the die 106 immediately above the structure 402, 600. Optionally, TIM (not shown) may be disposed between the heat transfer structure 402, 600 and the top and bottom surfaces 140, 142 of the dies 106 sandwiching the structure 402, 600.

The heat transfer structure 402, 600 is in good thermal contact, either by direct contact or through a heat transfer intermediary, such as TIM, with the heat transfer structure 810. In one example, the heat transfer structure 402, 600 functions as the jumper 912 (shown in FIG. 9) connecting the heat transfer structures 810 disposed on vertically stacked adjacent dies 106.

When heat transfer structures $110_A$ our optionally utilized, the heat transfer structure 402, 600 may be coupled to the heat transfer structures $110_A$ as described with reference to FIGS. 4-6. Thus, the heat transfer structures 402, 600, 810 efficiently removes heat from the surfaces of the dies 106, and conducts the removed heat to the heat transfer structures $110_A$, which readily transfers heat from the heat transfer structure 402, 600 vertically out of the chip package assembly 100, for example, to the cover 102. The heat transfer structures $110_A$ may be coupled to the heat transfer structure 402, 600 as described above or by other suitable technique.

When utilized with or without optional heat transfer structures $110_A$, optional the heat transfer structures $110_B$ may be coupled or not coupled to the heat transfer structure 402, 600 as described with reference to FIG. 5. As the heat transfer structure 402, 600 is in contact with the heat transfer structure 810, the heat transfer structures $110_B$ are also coupled to the heat transfer structure 810, thus improving the efficiency and speed of heat transfer from the surfaces the dies 106 vertically out of the chip package assembly 100.

FIG. 11 a schematic sectional view of another chip package assembly 1100 having at least one heat transfer structure providing efficient heat transfer paths away from one or more integrated circuit (IC) dies 106. The chip package assembly 1100 is essentially the same as the chip package assembly 1000 described above, except wherein the heat transfer structures 706 and heat transfer structures 810 are utilized, while one or more of other heat transfer structure ($110_A$, $110_B$, 402, 600) being optional. Redundant descriptions of certain elements of the chip package assembly 1100 shown in FIG. 11 that have previously described above with reference to the prior Figures has been omitted for the sake of brevity.

The heat transfer structures 706 is disposed in a recess 702 formed between the top surface 142 of the die 106 closest the cover 102 and the cover 102. The heat transfer structure 706 is in contact with the die 106 and extends laterally outward beyond the sides 160 of the upper most die 106 (i.e., die 106 closest the cover 102). The heat transfer structures 706 are coupled to the heat transfer structures 810 disposed on the sides 160 of the dies 106. The heat transfer structures 810 may be configured as described above.

Optionally, one or more of the heat transfer structures $110_A$, the heat transfer structures $110_B$, and/or the heat transfer structures 402, 600 may be utilized with the heat transfer structures 706, 810 in the manner as described above with reference to FIG. 7.

As discussed above, the top surface 142 of the IC die 106 closest the cover 102 includes a recess 702 formed along at least one edge defined at the intersection of the side 160 and the top surface 142 of the IC die 106, which is configured to accept a heat transfer structure 706 disposed in the recess 702. The heat transfer structure 706 is connected to the heat transfer structures 810. The heat transfer structure 706 may also be optionally connected to one or more of the heat transfer structures $110_A$ extending upward within the die 106, and/or one or more of the heat transfer structures $110_B$ extending through the dielectric filler 112.

In the example of FIG. 11, the heat transfer structure 706 is a thermally conductive plate, foil, mesh and other suitable thermally conductive structure. The heat transfer structure 706 has an inner edge 708 that overlaps the side 160 of the upper most IC die 106, i.e., the IC die closest the cover 102. The heat transfer structure 706 may extend from the inner edge 708 to an outer edge 740 to increase the heat transfer area available to conduct heat between the structure 706 and the cover 102, ultimately improving the heat transfer efficiency away from the upper most die 106.

In one example, the heat transfer structure 706 has a ring shape. The inner edge 708 of the heat transfer structure 706 resides in the portions of the recess 702 formed in each of the four sides 160 of the upper most IC die 106. Alternatively, the inner edge 708 of the heat transfer structure 706 may reside in the recess 702 in only one, two or three sides 160 of the upper most IC die 106.

The heat transfer structure 706 includes a top surface 710 and a bottom surface 712. The top surface 710 of the heat transfer structure 706 faces the cover 102. In the example depicted in FIG. 11, TIM 114 is disposed between the top surface 710 of the heat transfer structure 706 and the bottom surface 144 of the cover 102 to enhance heat transfer therebetween. An inner portion 716 of the bottom surface 712 of the heat transfer structure 706 is in contact with the recess 702 formed in the IC die 106 and the heat transfer structure 1100 disposed on the side 160 of the die 106 directly below the recess 702. The inner portion 716 of the bottom surface 712 of the heat transfer structure 706 also provides a surface to receive heat transferred to the heat transfer structure 706 from the upper ends of the structures 110$_A$, when utilized. An outer portion 718 of the bottom surface 712 of the heat transfer structure 706 is in contact with the dielectric filler 112. The outer portion 718 of the bottom surface 712 of the heat transfer structure 706 provides a surface to receive heat transferred to the heat transfer structure 706 from the upper ends of the structures 110$_B$, when utilized. The heat transfer structure 402, 600 may also optionally be utilized with one or both of the structures 110$_A$, 110$_B$ to increase the overall efficiency of heat transfer way from the dies 106, and particularly, dies 106 farthest from the cover 102 which may be "insulated" by intervening dies 106 closer to the cover 102.

The heat transfer structure 110$_A$, 110$_B$, 402, 600, 706, 810 may be fabricated as described above or by another suitable technique. The structures 110$_A$, 110$_B$, 810 may be disposed in contact with the heat transfer structure 706 on all sides 160 of the die 106. Alternatively the structures 110$_A$, 110$_B$, 810 may be disposed in contact with the heat transfer structure 706 on at least one pair of opposing sides 160 of the IC die 106. In yet another example, the structures 110$_A$, 110$_B$, 810 may be disposed in contact with the heat transfer structure 706 on at least one or three sides 160 of the upper most IC die 106. Generally, the structures 110$_B$ are laterally surrounded by the dielectric filler 112, while the structures 810 are laterally bounded by the dielectric filler 112 on one side and the side 160 of the die 106 on the other side.

Figure 12:
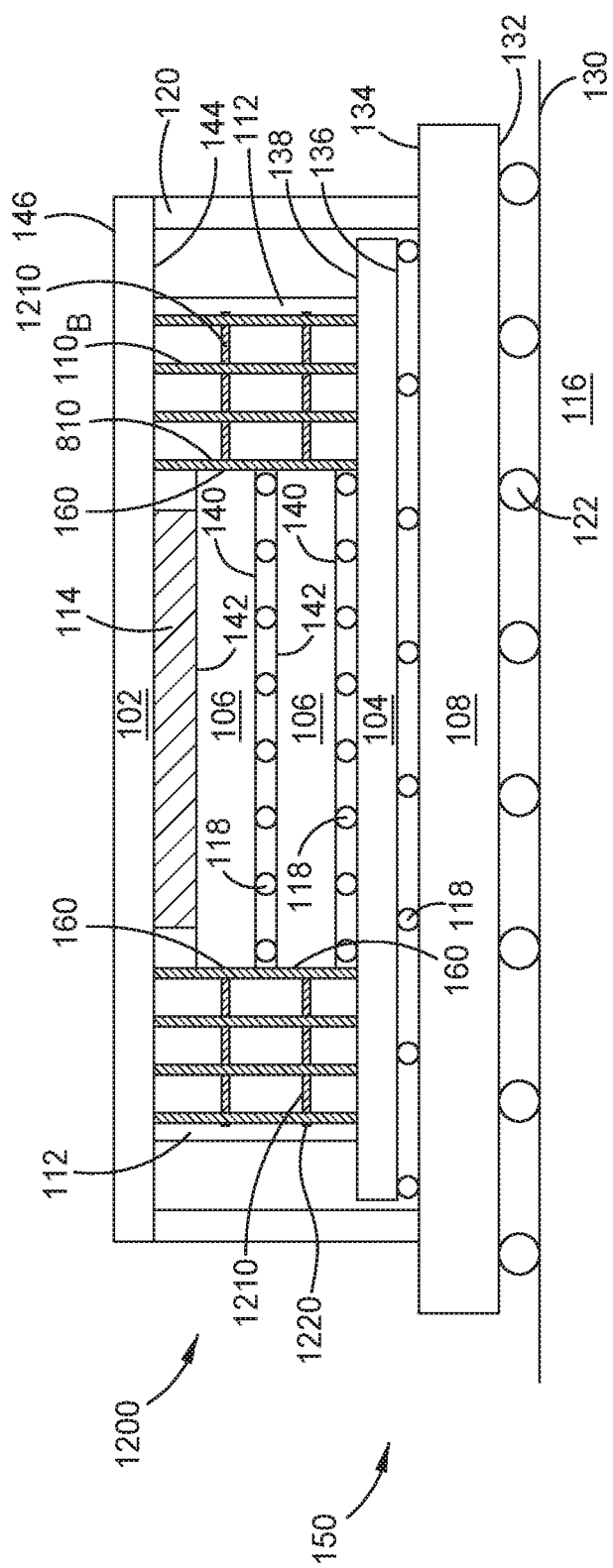

FIG. 12 is a schematic sectional view of another chip package assembly 1200 having at least one heat transfer structure providing efficient heat transfer paths away from one or more integrated circuit (IC) dies 106. The chip package assembly 1200 is essentially the same as the chip package assemblies described above, except wherein one or more heat transfer structures 1210 is extends horizontally (i.e., parallel to the top surface 142) along one or more sides 160 of the die 106. The heat transfer structures 1210 may be utilized while in a form disposed within the die 106, or in a form extending from a side 160 of the die 106.

The heat transfer structures 1210 may be utilized within the chip package assembly 1200 along without other heat transfer structures, or in concert with one or more of the other types of heat transfer structures described herein. In the example of FIG. 12, one or more of the heat transfer structures 110$_A$ (as shown in FIG. 1), the heat transfer structures 110$_B$, heat transfer structures 402, 600 (as shown in FIG. 4), and/or the heat transfer structures 1210 may optionally be utilized with the heat transfer structure 1210. In the example depicted in FIG. 12, optional heat transfer structures 110$_B$ and 1210 are shown utilized along with heat transfer structures 1210. Redundant descriptions of certain elements of the chip package assembly 1200 shown in FIG. 12 that have previously described above with reference to the prior Figures has been omitted for the sake of brevity.

As described above, the heat transfer structures 1210 extend from the sides 160 of the dies 106. The heat transfer structure 1210 is formed from one or more of the metalization layers comprising the die 106. In one example, the heat transfer structure 1210 is formed from one or more copper metalization layers of the die 106. In the example depicted in FIG. 12, the heat transfer structure 1210 extends in an orientation that is substantially parallel to the top surface 142 of the dies 106, and of course, perpendicular to the sides 160.

Figure 13:
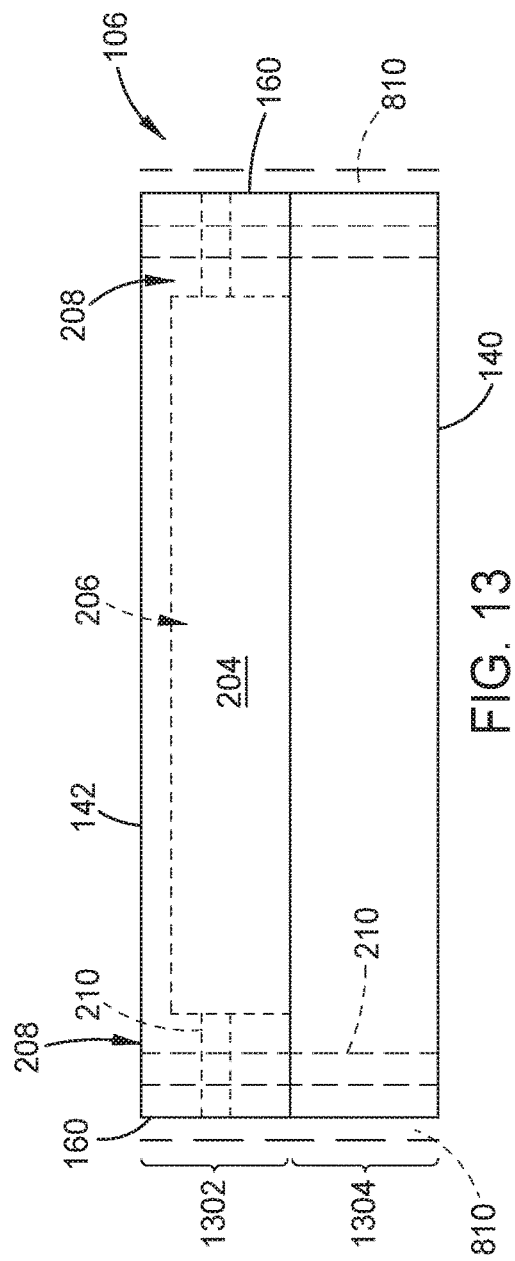
FIGS. 13-14 are schematic sectional and top views of an IC die illustrating a heat transfer structure that may be utilized in the chip package assembly of FIG. 12, among others.
Figure 14:
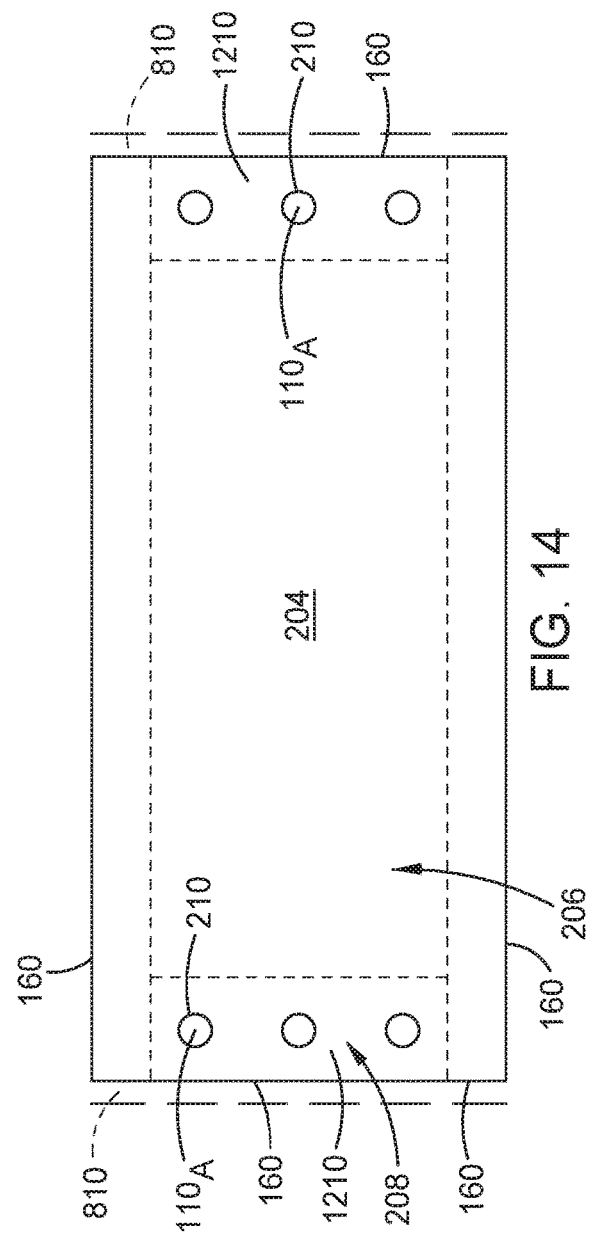

FIGS. 13-14 depict a die 106 having one example of the heat transfer structure 1210 disposed within the sides 160 of the die 106. The die 106 and heat transfer structure 1210 may be utilized in the chip package assembly 1200 illustrated in FIG. 12, among other chip package assemblies. The heat transfer structure 1210 is configured to more heat way from the center of the die 106. The die 106 depicted in FIG. 13 includes a device and metalization region (DAMR) 1302 formed on a substrate 1304. The DAMR 1032 is comprised of devices fabricated using layers of materials formed by front-end-of-line (FEOL) processing and metalization fabricated using layers of materials formed by back-end-of-line (BEOL) processing. An active circuit area 206 containing functional circuitry 204 of the die 106 is formed in the DAMR 1302.

The heat transfer structure 1210 is formed from one or more of the metal layers within the DAMR 1302 and is disposed in the border area 208. Optionally, the transfer structures 1210 may be built up to be as thick as the height of the DAMR 1302 or even the height of the IC die 106. As discussed above with reference to FIG. 2, the border area 208 resides between the active circuit area 206 and the sides 160 of the die 106, and generally contains no functional circuitry 204. In one example, the heat transfer structure 1210 extends across the border area 208 to the side 160 of the die 106. The heat transfer structure 1210 may or may not be exposed through the side 160 of the die 106. In one example such as illustrated in FIG. 12, the transfer structures 1210 extends across the border area 208 to a scribe line 1220 at which the die 106 is diced from the wafer substrate. The heat transfer structure 1210 may optionally extend into the active circuit area 206 of the die 106, but is electrically isolated from the functional circuitry 204 of the die 106.

In the example depicted in FIGS. 13 and 14, the heat transfer structure 1210 extends into the border area 208. A hole 210 is formed in the border area 208 through the heat transfer structure 1210. The hole 210 may extend through both the DAMR 1302 and the substrate 1304. Such as described above with reference to FIG. 4, a heat transfer structure 110$_A$ is disposed in the hole 210 and thus in contact with the heat transfer structure 1210. In this manner, the heat transfer structures 110$_A$, 1210 effectively and efficiently remove from the interior of the die 106 vertically out of the chip package assembly.

To further increase the heat transfer efficiency of the heat transfer structure 1210 and die 106 depicted in FIGS. 13 and 14, heat transfer structures 810 may be formed on the side 160 of the die in contact with the heat transfer structure 1210. Heat transfer structures 110$_B$ and 402, 600 may also be optionally utilized to increase the size of the heat transfer paths out of the chip package assembly 1200.

Figure 15:
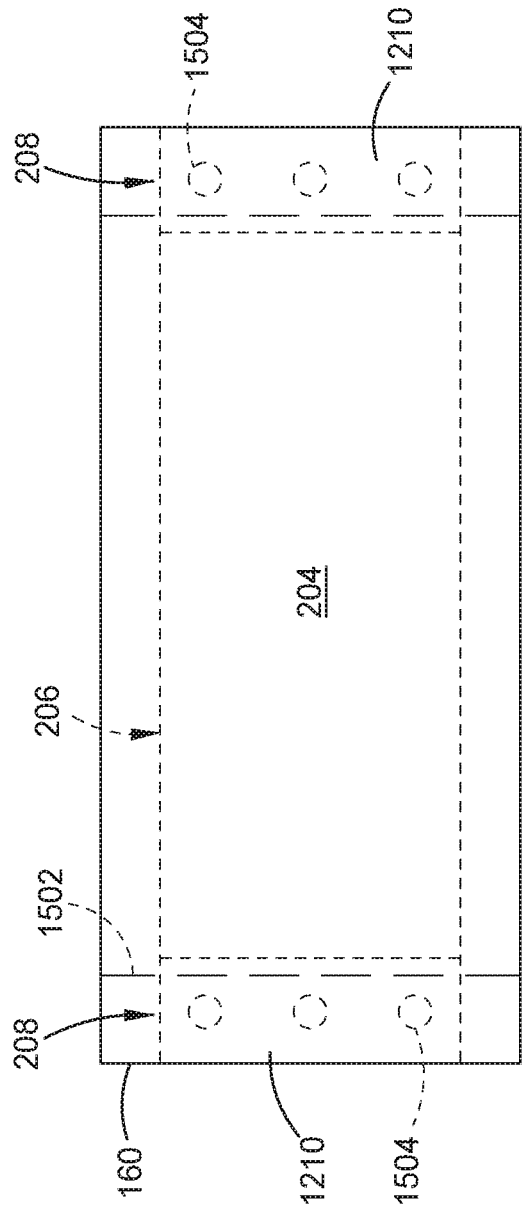
FIGS. 15-16 are schematic top and sectional views of an IC die illustrating another heat transfer structure that may be utilized in the chip package assembly of FIG. 12, among others.
Figure 16:
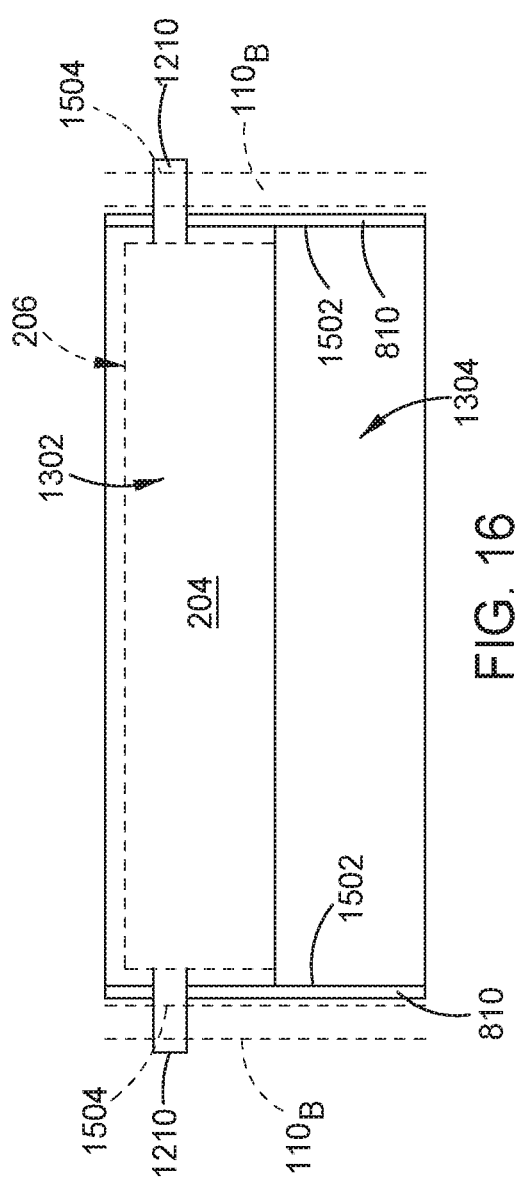

FIGS. 15-16 depict a die 106 having an alternative example of the heat transfer structure 1210 extending laterally from the sides 160 of the die 106. The die 106 and heat transfer structure 1210 may be utilized in the chip package assembly 1200 illustrated in FIG. 12, among other chip package assemblies. As described above, the heat transfer structure 1210 is formed from one of the metal layers within the DAMR 1302. However, in the example depicted in FIGS. 15-16, some of the material comprising the border area 208 is removed from around the heat transfer structure 1210, so that a portion of the heat transfer structure 1210 cantilevered from a new sidewall 1502 of the die 106. The material comprising the border area 208 may be removed by selective etching, laser ablation, milling or other suitable technique. The sidewall 1502 of the die 106 remains in the border area 208, being spaced from the active circuit area 206 and functional circuitry 204 of the die 106. The heat transfer structure 1210 may or may not be exposed through the side 160 of the die 106. The heat transfer structure 1210 may optionally extend into the active circuit area 206 of the die 106, but is electrically isolated from the functional circuitry 204 of the die 106.

Although not depicted in FIGS. 15-16, the sidewall 1502 of the die 106 may be sufficiently spaced from the active circuit area 206 so that a hole 210 may be formed through the border area 208 and the heat transfer structure 1210. Such as described above with reference to FIG. 4 and FIGS. 13-14, a heat transfer structure $110_A$ is disposed in the hole 210 and thus in contact with the heat transfer structure 1210. In this manner, the heat transfer structures $110_A$, 1210 effectively and efficiently remove from the interior of the die 106 vertically out of the chip package assembly.

Optionally, the heat transfer structure 1210 depicted in FIGS. 15-16 may be utilized with one or more of the heat transfer structure 810, with or without the use of any one or more of the heat transfer structures $110_A$, $110_B$, 402, 600. As discussed above, the heat transfer structure 810 may be formed on the side 160 of the die 106 and be in contact with the heat transfer structure 1210. Thus, the heat transfer structure 810 provides a vertical heat transfer path away from the die 106 for heat to be removed laterally from the die 106 by the heat transfer structure 1210. This arrangement is particularly effective removing heat from dies 106 farthest from the cover 102 which may be "insulated" by intervening dies 106 closer to the cover 102.

The exposed portion of the heat transfer structure 1210 may also be optionally connected to the heat transfer structures $110_B$ utilizing a hole 1504 disposed through the structure 1210 into which the heat transfer structure $110_B$ is inserted. Alternatively, the heat transfer structures $110_B$ may be connected to a surface of the heat transfer structure 1210 without passing therethrough.

FIG. 17 depicts another chip package assembly 1700 having heat transfer structures 706, 1210 extending laterally from the die 106. The heat transfer structures 706 may be fabricated as described above with reference to FIG. 7, or by another suitable technique. The heat transfer structures 1210 may be fabricated as described above with reference to FIGS. 12-16, or by another suitable technique. As illustrated in FIG. 17, the heat transfer structures 706, 1210 are utilized with one or more of the heat transfer structures $110_B$, and can be utilized with or without any one or more of the heat transfer structures $110_A$, 402, 600, 810. The exposed portion of the heat transfer structure 1210 is connected to the heat transfer structures $110_B$. The heat transfer structures $110_B$ may be formed on the surface of the heat transfer structure 1210, or as illustrated in FIG. 17, the heat transfer structures $110_B$ may pass through a hole 1504 formed through the heat transfer structure 1210. When the heat transfer structures $110_B$ is disposed through the hole 1504 of the heat transfer structure 1210 of one die 106, the heat transfer structures $110_B$ can contact the heat transfer structure 1210 of another die 106 of the stack of dies comprising the chip package assembly 1700, thus providing an efficient heat transfer path vertically out of the chip package assembly 1700 for dies 106 located below other dies 106 and spaced from the cover 102. Optionally, additional heat transfer structures $110_B$ may be disposed outward of the heat transfer structures $110_B$ coupled to the heat transfer structures 1210 to provide additional vertical heat transfer paths out of the chip package assembly 1700.

FIG. 18 a schematic sectional view of another chip package assembly 1800 having at least one heat transfer structure providing efficient heat transfer paths away from one or more integrated circuit (IC) dies 106. The chip package assembly 1800 is essentially the same as the chip package assemblies 1200 and 1700 described above, except wherein the heat transfer structures 706 and heat transfer structures 1210 are utilized, while one or more of other heat transfer structure ($110_A$, $110_B$, 402, 600, 810) being optional. Redundant descriptions of certain elements of the chip package assembly 1800 shown in FIG. 18 that have previously described above with reference to the prior Figures has been omitted for the sake of brevity.

The heat transfer structures 706 is disposed in a recess 702 formed between the top surface 142 of the die 106 closest the cover 102 and the cover 102. The heat transfer structure 706 is in contact with the die 106 and extends laterally outward beyond the sides 160 of the upper most die 106 (i.e., die 106 closest the cover 102). Although the heat transfer structure 706 may be used alone with the heat transfer structures 1210, coupling the heat transfer structures 1210 to the heat transfer structure 706 utilizing one or more of the heat transfer structures $110_A$, $110_B$ and 810 increases the rate of vertical heat transfer out of the chip package assembly 1800, which is particularly advantageous to the performance of dies 106 that are spatially separated from the cover 102 by one or more other intervening dies 106. The heat transfer structure 402, 600 may also be utilized.

The one or more of the heat transfer structures $110_A$, the heat transfer structures $110_B$, and/or the heat transfer structures 810 may be utilized with the heat transfer structures 706, 1210 in the manner as described above or by another suitable technique.

In the example depicted in FIG. 18, the top surface 142 of the IC die 106 closest the cover 102 includes a recess 702 formed along at least one edge defined at the intersection of the side 160 and the top surface 142 of the IC die 106, which is configured to accept a heat transfer structure 706 disposed in the recess 702. The heat transfer structure 706 is connected to the heat transfer structures 1210 via one or more heat transfer structures $110_B$. Additionally or in the alternative, one or both of the heat transfer structures $110_A$, 810 may also be utilized to connect the heat transfer structure 706 to the heat transfer structures 1210. The heat transfer structure 706 may also be optionally connected to one or more of the heat transfer structures $110_A$ extending upward within the die 106 that are connect to the heat transfer structures 1210, and/or one or more of the heat transfer structures $110_B$ extending through the dielectric filler 112 that are not directly connected to the heat transfer structures 1210.

The heat transfer structure 706 may be constructed as described above. The heat transfer structure 706 may have a ring shape. Alternatively, the inner edge 708 of the heat transfer structure 706 may reside in the recess 702 in only one, two or three sides 160 of the upper most IC die 106. The heat transfer structure 706 may be coupled to the other heat transfer structures as described above.

Thus, a chip package assembly and method for fabricating the same have been provided which utilize a plurality of electrically floating heat transfer structures to improve heat transfer laterally and vertically from integrated circuit (IC) dies comprising the chip package assembly. The heat transfer structures advantageously provide robust conductive heat transfer paths from sides of the IC dies. The heat transfer structures can also be selectively positioned to improve the heat transfer profile across the package assembly. The enhanced heat transfer vertically out of the chip package assembly significantly improves reliability and performance, while also reducing hot spots which could induce warpage or provide insufficient temperature control of the IC dies. Significantly, the ability of the heat transfer structures to remove heat from the sides of dies advantageously enhances thermal control of middle and bottom dies of vertical die stack, thus significantly reducing thermal coupling and temperature rise within the chip packages assembly, which advantageously improves electromigration (EM) lifetime.

In addition to the claims described below, the technology described above may also be illustrated by one or more of the following non-limiting examples:

Example 1. A chip package assembly comprising:
 a substrate having a first surface and an opposing second surface;
 a first integrated circuit (IC) die having a first surface and an opposing second surface, the second surface of the first IC die mounted to the first surface of the substrate, the first surface of the first IC die having a recess formed along at least one edge;
 a conductive member disposed in the recess; and
 a first plurality of electrically floating heat transfer structures extending parallel to a side of the first IC die and coupled to the conductive member.

Example 2. The chip package assembly of example 1, wherein the recess extends along all edges of the first surface of the first IC die.

Example 3. The chip package assembly of example 2, wherein the conductive member has a ring shape and is disposed along all edges of the first surface of the first IC die.

Example 4. The chip package assembly of example 1, wherein the first plurality of electrically floating heat transfer structures pass through the first die.

Example 5. The chip package assembly of example 1, wherein the first plurality of electrically floating heat transfer structures are disposed outward of the side of the first die.

Example 6. The chip package assembly of example 5, wherein first plurality of electrically floating heat transfer structures are disposed in contact with the side of the first die.

Example 7. The chip package assembly of example 5, wherein first plurality of electrically floating heat transfer structures are spaced from the side of the first die.

Example 8. The chip package assembly of example 1 further comprising:
 a conductive heat transfer structure extending laterally from the first die.

Example 9. A chip package assembly comprising:
 a substrate having a first surface and an opposing second surface;
 a first integrated circuit (IC) die having a first surface and an opposing second surface, the second surface of the first IC die mounted to the first surface of the substrate;
 a first plurality of electrically floating heat transfer structures formed from metalization layers of the first IC die;
 a second IC die having a first surface and an opposing second surface, the second surface of the second IC mounted above the first surface of the first IC die;
 a second plurality of electrically floating heat transfer structures formed from metalization layers of the second IC die; and
 a third plurality of conductive heat transfer structures coupling the first plurality of electrically floating heat transfer structures to the second plurality of electrically floating heat transfer structures.

Example 10. The chip package assembly of example 9, wherein the third plurality of conductive heat transfer structures pass through the first die.

Example 11. The chip package assembly of example 9, wherein the third plurality of conductive heat transfer structures pass are disposed outward of the side of the first die.

Example 12. The chip package assembly of example 11, wherein the third plurality of conductive heat transfer structures pass are disposed in contact with a side of the first die.

Example 13. The chip package assembly of example 11, wherein third plurality of conductive heat transfer structures are spaced from the side of the first die.

Example 14. The chip package assembly of example 9, wherein third plurality of conductive heat transfer structures extend cantilevered from a side of the first die.

Example 15. A chip package assembly comprising:
 a substrate having a first surface and an opposing second surface;
 a first integrated circuit (IC) die having a first surface and an opposing second surface, the second surface of the first IC die mounted to the first surface of the substrate;
 a second IC die having a first surface and an opposing second surface, the second surface of the second IC mounted above the first surface of the first IC die;
 and a first electrically floating heat transfer structure extending laterally out between the first IC die and the second IC die.

Example 16. The chip package assembly of example 15 further comprising:
 a second conductive heat transfer structure disposed through the second IC die and coupled to the first electrically floating heat transfer structure.

Example 17. The chip package assembly of example 15 further comprising:
 a second conductive heat transfer structure disposed outward a side of the second IC die and coupled to the first electrically floating heat transfer structure.

Example 18. The chip package assembly of example 17, wherein the second conductive heat transfer structure is disposed in contact with the side of the second IC die.

Example 19. The chip package assembly of example 17, wherein the second conductive heat transfer structure is spaced from the side of the second IC die.

Example 20. The chip package assembly of example 15 further comprising:
 a second conductive heat transfer structure disposed perpendicular to the first conductive heat transfer structure; and
 a third conductive heat transfer structure disposed in a recess formed in the first surface of the second IC die, the second conductive heat transfer coupling the first electrically floating heat transfer structure to the third conductive heat transfer structure.

Example 21. A chip package assembly comprising:
 a substrate having a first surface and an opposing second surface;
 a first integrated circuit (IC) die having a first surface and an opposing second surface, the second surface of the first IC die mounted to the first surface of the substrate;
 a second IC die having a first surface and an opposing second surface, the second surface of the second IC mounted above the first surface of the first IC die; and
 a first electrically floating heat transfer structure disposed in contact with a side of the first IC die between the first and second surfaces.

Example 22. The chip package assembly of example 21, wherein the first electrically floating heat transfer structure is disposed in contact with a side of the second IC die.

Example 23. A chip package assembly comprising:
 a substrate having a first surface and an opposing second surface;

a first integrated circuit (IC) die having a first surface and an opposing second surface, the second surface of the first IC die mounted to the first surface of the substrate;

a second IC die having a first surface and an opposing second surface, the second surface of the second IC mounted above the first surface of the first IC die;

a dielectric filler laterally surrounding the first and second IC dies; and a first electrically floating heat transfer structure disposed through the dielectric filler outward of a side of the first IC die.

Example 24. The chip package assembly of example 22 further comprising:

a second electrically floating heat transfer structure disposed in contact with the first IC die, the dielectric filler and the first electrically floating heat transfer structure.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
   a substrate having a first surface and an opposing second surface;
   a first integrated circuit (IC) die having a first surface, an opposing second surface, and four lateral sides, the second surface of the first IC die mounted to the first surface of the substrate; and
   a plurality of electrically floating conductive heat transfer structures extending in a first direction defined between the first and second surfaces of the first IC die, a first conductive heat transfer structure of the plurality of electrically floating conductive heat transfer structures part of a first conductive heat transfer path having a length in the first direction at least as long as a distance between the first and second surfaces of the first IC die.

2. The chip package assembly of claim 1, wherein the first IC die further comprises:
   a first hole open extending between the first and second surfaces of the first IC die, the first conductive heat transfer structure disposed through the first hole.

3. The chip package assembly of claim 2 further comprising:
   a cover disposed over the first IC die, at least one of the plurality of electrically floating conductive heat transfer structures extending across a space defined between the cover and first IC die; and
   a dielectric filler disposed between the plurality of electrically floating conductive heat transfer structures, the dielectric filler substantially filling the space.

4. The chip package assembly of claim 2 further comprising:
   a second IC die having a first surface and an opposing second surface, the second surface of the second IC die mounted above the first surface of the first IC die, the second IC die further comprising a second hole open extending between the first and second surfaces of the second IC die, the first conductive heat transfer path defined through the first and second holes.

5. The chip package assembly of claim 4, wherein the first conductive heat transfer structure passes through the first and second holes.

6. The chip package assembly of claim 4, wherein the first surface of the second IC die further comprises:
   a recess formed along at least one edge; and a conductive member disposed in the recess and connected to at least the first conductive heat transfer structure.

7. The chip package assembly of claim 2 further comprising:
   a second IC die having a first surface and an opposing second surface, the second surface of the second IC die mounted above the first surface of the first IC die; and
   a first metal layer disposed in contact with the first conductive heat transfer structure and extending out from between the first and second IC dies.

8. The chip package assembly of claim 7 further comprising:
   a third IC die having a first surface and an opposing second surface, the second surface of the third IC die mounted above the first surface of the second IC die; and
   a second metal layer disposed in contact with the first conductive heat transfer structure and extending out from between the second and third IC dies.

9. The chip package assembly of claim 8 further comprising:
   a second heat transfer structure coupling the first metal layer to the second metal layer.

10. The chip package assembly of claim 9, wherein the first surface of the third IC die further comprises:
    a recess formed along at least one edge; and
    a conductive member disposed in the recess and connected to the first conductive heat transfer structure and the second metal layer by a third heat transfer structure.

11. The chip package assembly of claim 1, wherein the first IC die further comprises:
    a first thermally conductive material disposed on at least a first side of the four lateral sides.

12. The chip package assembly of claim 11 further comprising:
    a second heat transfer structure extending laterally from the first thermally conductive material disposed on the first side of the first IC die.

13. The chip package assembly of claim 12, wherein the second heat transfer structure is coupled to the first thermally conductive material.

14. The chip package assembly of claim 13 further comprising:
    a cover disposed over the first IC die, at least one of the first thermally conductive material and the first conductive heat transfer structure extending across a space defined between the cover and first IC die; and
    a dielectric filler disposed between the plurality of electrically floating conductive heat transfer structures, the dielectric filler substantially filling the space.

15. The chip package assembly of claim 11, wherein the first surface of the first IC die further comprises:
    a recess formed along at least one edge; and
    a conductive member disposed in the recess and connected to the first thermally conductive material.

16. The chip package assembly of claim 11 further comprising:
    a second IC die having a first surface, an opposing second surface, and four lateral sides, the second surface of the first IC die mounted to the first surface of the substrate; and
    a second thermally conductive material disposed on at least a first side of the four lateral sides of the second IC die.

17. The chip package assembly of claim 16, wherein the first thermally conductive material is part of a second heat transfer path extending in the first direction through the second thermally conductive material.

18. The chip package assembly of claim 17, wherein the first thermally conductive material is contiguously with the second thermally conductive material.

19. The chip package assembly of claim 18, wherein the first surface of the second IC die further comprises:
   a recess formed along at least one edge; and
   a conductive member disposed in the recess and connected to the second thermally conductive material.

20. A chip package assembly comprising:
   a first integrated circuit (IC) die having a first surface, an opposing second surface, and four lateral sides;
   a first heat transfer structure disposed on at least a first side of the four lateral sides of the first IC die, the first heat transfer structure fabricated from a metalization layer of the first IC die;
   a second IC die having a first surface, an opposing second surface, and four lateral sides, the second surface of the second IC die mounted to the first surface of the first IC die;
   a second heat transfer structure disposed on at least a first side of the four lateral sides of the second IC die, the second heat transfer structure fabricated from a metalization layer of the second IC die; and
   a third heat transfer structure connecting the first heat transfer structure to the second heat transfer structure.

* * * * *